United States Patent
Iwata et al.

(10) Patent No.: US 10,078,114 B2
(45) Date of Patent: Sep. 18, 2018

(54) TEST POINT CIRCUIT, SCAN FLIP-FLOP FOR SEQUENTIAL TEST, SEMICONDUCTOR DEVICE AND DESIGN DEVICE

(71) Applicant: Renesas Electronics Corporation, Tokyo (JP)

(72) Inventors: Hiroyuki Iwata, Tokyo (JP); Jun Matsushima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 120 days.

(21) Appl. No.: 15/220,427

(22) Filed: Jul. 27, 2016

(65) Prior Publication Data
US 2017/0089979 A1 Mar. 30, 2017

(30) Foreign Application Priority Data

Sep. 24, 2015 (JP) ................................ 2015-186270
Feb. 10, 2016 (JP) ................................ 2016-023384

(51) Int. Cl.
*G01R 31/3177* (2006.01)
*G01R 31/317* (2006.01)
*G01R 31/3183* (2006.01)
*G01R 31/3181* (2006.01)

(52) U.S. Cl.
CPC ..... *G01R 31/3177* (2013.01); *G01R 31/3183* (2013.01); *G01R 31/31723* (2013.01); *G01R 31/31727* (2013.01); *G01R 31/31813* (2013.01)

(58) Field of Classification Search
CPC .......... G01R 31/3177; G01R 31/31723; G01R 31/31727; G01R 31/31813; G01R 31/3183

USPC ........ 714/727, 726, 728, 729, 738, 739, 724
See application file for complete search history.

(56) References Cited

U.S. PATENT DOCUMENTS

| | | | | |
|---|---|---|---|---|
| 6,370,664 B1* | 4/2002 | Bhawmik | ........ | G01R 31/31858 714/726 |
| 6,463,561 B1* | 10/2002 | Bhawmik | ........ | G01R 31/31707 714/726 |
| 7,036,060 B2* | 4/2006 | Nakao | ............ | G01R 31/318547 714/726 |
| 7,331,032 B2* | 2/2008 | Wang | ............... | G01R 31/31704 703/16 |
| 8,756,468 B2* | 6/2014 | Sinanoglu | ...... | G01R 31/318547 714/727 |
| 8,841,974 B2* | 9/2014 | Sul | ....................... | H03K 3/0315 324/527 |

(Continued)

OTHER PUBLICATIONS

Gu et al., An Effort-Minimized Logic BIST Implementation Method, 2001, IEEE, pp. 1002-1010.*

(Continued)

*Primary Examiner* — John J Tabone, Jr.
(74) *Attorney, Agent, or Firm* — Mattingly & Malur, PC

(57) ABSTRACT

It is possible to reduce the number of test point circuits to be inserted necessary to accomplish a target fault coverage, to suppress an increase in an area overhead, and to reduce a test time. A test point circuit according to an embodiment constitutes a scan chain, and captures, in one capture operation period of a clock sequential test, a first operation result in a second capture clock that comes after a first capture clock, the first operation result having been captured by a test point circuit at a previous stage or a last stage of the scan chain in the first capture clock.

24 Claims, 30 Drawing Sheets

(56) References Cited

U.S. PATENT DOCUMENTS

| | | | | |
|---|---|---|---|---|
| 8,887,015 B2* | 11/2014 | Iwata | G06F 17/505 | 714/726 |
| 9,194,915 B2* | 11/2015 | Bheemanna | G01R 31/31855 | |
| 9,297,855 B1* | 3/2016 | Jindal | G01R 31/3177 | |
| 9,322,876 B2* | 4/2016 | Bheemanna | G01R 31/31855 | |
| 9,501,589 B2* | 11/2016 | Lin | G06F 17/5022 | |
| 2001/0052094 A1* | 12/2001 | Hamidi | G01B 31/31858 | 714/724 |
| 2003/0023941 A1* | 1/2003 | Wang | G01R 31/31704 | 716/103 |
| 2003/0200492 A1* | 10/2003 | Nakao | G01R 31/318547 | 714/724 |
| 2005/0066242 A1* | 3/2005 | Wang | G01R 31/31858 | 714/700 |
| 2005/0081130 A1* | 4/2005 | Rinderknecht | G01R 31/318547 | 714/726 |
| 2007/0168798 A1* | 7/2007 | Cooke | G01R 31/318547 | 714/726 |
| 2007/0266283 A1* | 11/2007 | Balakrishnan | G01R 31/318547 | 714/726 |
| 2008/0195346 A1* | 8/2008 | Lin | G01R 31/31857 | 702/119 |
| 2008/0195904 A1* | 8/2008 | Wang | G01R 31/318547 | 714/726 |
| 2011/0078523 A1* | 3/2011 | Kanomata | G01R 31/31858 | 714/726 |
| 2012/0331358 A1* | 12/2012 | Itou | G01B 31/318547 | 714/726 |
| 2013/0019134 A1* | 1/2013 | Iwata | G06F 17/505 | 714/726 |
| 2013/0166976 A1* | 6/2013 | Huang | G06F 17/5081 | 714/727 |
| 2014/0298279 A1* | 10/2014 | Setohara | G06F 17/5045 | 716/106 |
| 2014/0310667 A1* | 10/2014 | Setohara | G06F 17/5045 | 716/106 |
| 2015/0074477 A1* | 3/2015 | Bheemanna | G01R 31/31855 | 714/727 |

OTHER PUBLICATIONS

Sarrazin et al., Scan design with shadow flip-flops for low performance overhead and concurrent delay fault detection, 2013, EDAA, pp. 1077-1082.*

Dabaleena Das et al., "Reducing Test Data Volume Using External/LBIST Hybrid Test Patterns", International Test Conference, 2000.

* cited by examiner

OPERATION WAVEFORM EXAMPLE OF SCAN TEST BY SINGLE CAPTURE CLOCK

OPERATION WAVEFORM EXAMPLE OF CLOCK SEQUENTIAL TESET BY PLURALITY OF CAPTURE CLOCKS

IN USER OPERATION

IN SCAN TEST OPERATION

| DATA | SIN | SMC | SEQ_TEST_EN | CLK | Q |
|---|---|---|---|---|---|
| 0 | 0/1 | 0 | 0 | 01 | 0 |
| 1 | 0/1 | 0 | 0 | 01 | 1 |
| 0 | 0 | 0 | 1 | 01 | 0 |
| 0 | 1 | 0 | 1 | 01 | 1 |
| 1 | 0 | 0 | 1 | 01 | 1 |
| 1 | 1 | 0 | 1 | 01 | 0 |
| 0/1 | 0/1 | 1 | 0 | 01 | 0 |
| 0/1 | 0 | 1 | 1 | 01 | 1 |
| 0/1 | 1 | 1 | 1 | 01 | 0 |

Fig. 20
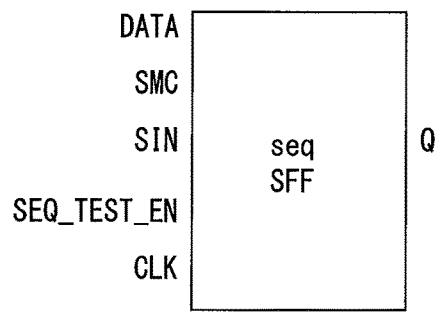
Fig. 21
| SMC | SEQ_TEST_EN | CLK | Q |
|---|---|---|---|
| 0 | 0 | 01 | DATA |
| 0 | 1 | 01 | DATA⊕SIN OR ¬(DATA⊕SIN) |
| 1 | 0/1 | 01 | SIN OR ¬SIN |
Fig. 22
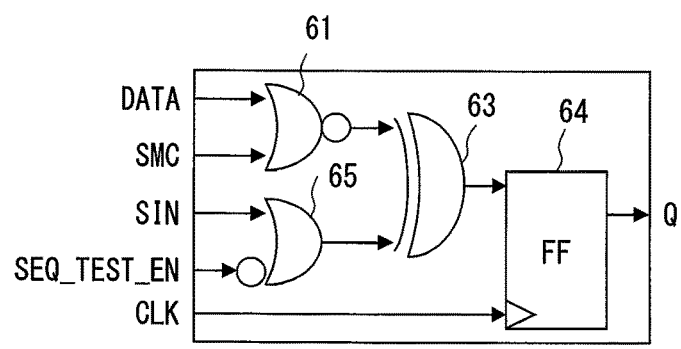
60A

| DATA | SIN | SMC | SEQ_TEST_EN | CLK | Q |
|---|---|---|---|---|---|
| 0 | 0/1 | 0 | 0 | 01 | 0 |
| 1 | 0/1 | 0 | 0 | 01 | 1 |
| 0 | 0 | 0 | 1 | 01 | 1 |
| 0 | 1 | 0 | 1 | 01 | 0 |
| 1 | 0 | 0 | 1 | 01 | 0 |
| 1 | 1 | 0 | 1 | 01 | 1 |
| 0/1 | 0/1 | 1 | 0 | 01 | 0 |
| 0/1 | 0 | 1 | 1 | 01 | 0 |
| 0/1 | 1 | 1 | 1 | 01 | 1 |

| DATA | SIN | SMC | SEQ_TEST_EN | CLK | Q |
|---|---|---|---|---|---|
| 0 | 0/1 | 0 | 0 | 01 | 0 |
| 1 | 0/1 | 0 | 0 | 01 | 1 |
| 0 | 0 | 0 | 1 | 01 | 0 |
| 0 | 1 | 0 | 1 | 01 | 1 |
| 1 | 0 | 0 | 1 | 01 | 1 |
| 1 | 1 | 0 | 1 | 01 | 0 |
| 0/1 | 0 | 1 | 0/1 | 01 | 1 |
| 0/1 | 1 | 1 | 0/1 | 01 | 0 |

60C

Fig. 27
| DATA | SIN | SMC | SEQ_TEST_EN | CLK | Q |
|---|---|---|---|---|---|
| 0 | 0/1 | 0 | 0 | 01 | 0 |
| 1 | 0/1 | 0 | 0 | 01 | 1 |
| 0 | 0 | 0 | 1 | 01 | 0 |
| 0 | 1 | 0 | 1 | 01 | 1 |
| 1 | 0 | 0 | 1 | 01 | 1 |
| 1 | 1 | 0 | 1 | 01 | 0 |
| 0/1 | 0 | 1 | 0/1 | 01 | 0 |
| 0/1 | 1 | 1 | 0/1 | 01 | 1 |
Fig. 28
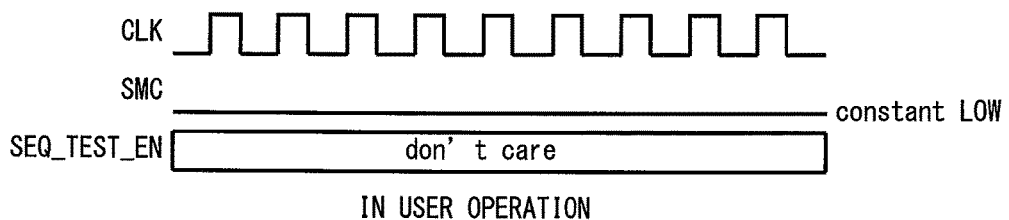
IN USER OPERATION
Fig. 29
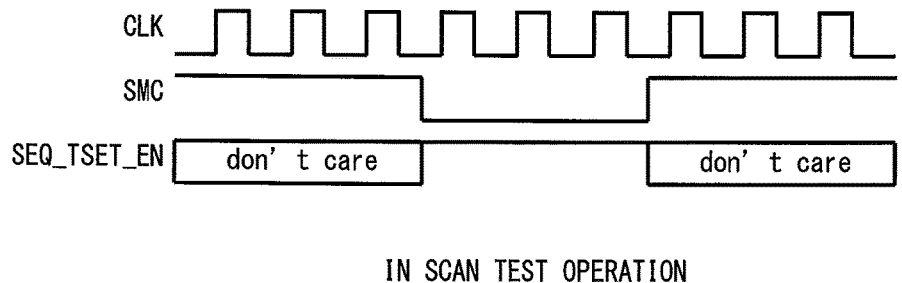
IN SCAN TEST OPERATION

| SMC | SEQ_TEST_EN | CLK | Q |
|---|---|---|---|
| 0 | 0 | 01 | DATA |
| 0 | 1 | 01 | DATA⊕DATA2 OR ¬(DATA⊕DATA2) |
| 1 | 0/1 | 01 | SIN OR ¬SIN |

TEST POINT CIRCUIT, SCAN FLIP-FLOP FOR SEQUENTIAL TEST, SEMICONDUCTOR DEVICE AND DESIGN DEVICE

CROSS-REFERENCE TO RELATED APPLICATIONS

This application is based upon and claims the benefits of priorities from Japanese patent applications No. 2015-186270 filed on Sep. 24, 2015 and No. 2016-023384, filed on Feb. 10, 2016, the disclosures of which are incorporated herein in their entirety by reference.

BACKGROUND

The present invention relates to a test point circuit, a scan flip-flop for a sequential test, a semiconductor device, and a design device, and relates to, for example, a technique applicable to a logic built-in self test (LBIST).

A general test method of a Large Scale Integration (LSI) includes a scan test. In order to perform the scan test, a flip-flop (FF) in a circuit is substituted with an FF including a multiplexer (MUX) called a scan FF. The MUX is able to switch a test input and a normal operation input by a scan enable signal.

When the scan test is performed, scan FFs are connected in serial and operate as a shift register (this will be referred to as a "scan chain") that can be controlled and observed from an external terminal of the LSI. The scan chain is subjected to a shift operation so that an arbitrary test pattern (load data) is supplied (loaded) to the respective scan FFs from the test input. This is referred to as a "scan shift operation". The test pattern set in the respective scan FFs is applied to a combination circuit to be tested.

By switching scan enable signals, an operation result in the combination circuit is captured by the scan FF from the normal operation input. This is called a "capture operation". The operation result acquired in the capture operation is shifted again by the scan FF and a response is observed (unload). At the same time as this unload, the next test pattern is applied (loaded). By comparing the value unloaded by a tester (unload data) with an expected value, a scan test of the LSI is executed.

In the scan test, it is required that the number of shift cycles correspond to the number of scan FFs connected to the scan chain. Therefore, an extremely large number of test steps are required in the scan test. Further, in order to execute the scan test of the LSI, it is required to store test data including the expected value of the load data and the unload data required for the scan shift operation in a memory of the tester. When the number of test steps is too large, the test data cannot be contained in the memory of the tester, and thus the necessary test cannot be performed.

As one example of a design for testability (DFT) that reduces the amount of test data, a logic built-in self test (LBIST) has been proposed (Debaleena Das, Nur A. Touba, "Reducing test data volume using external/LBIST hybrid test patterns", International Test Conference 2000). In the LBIST, the load data generated from a pseudo random pattern generator (PRPG) inside the circuit is supplied to the scan chain and the scan shift operation is performed, and the unload data after the capture operation is compressed by a response compressor (Multiple Input Signature Register: MISR) inside the circuit.

Therefore, while the scan test by the LBIST is being performed there is no need to apply the test data from an external tester and the test can be executed by only supplying clocks. After the test is performed for a desired period of time, the value compressed by the MISR is observed by the external tester, whereby it is determined whether there is a failure. Therefore, the only test data required for the external tester is a control sequence of the LBIST controller, initial values of the PRPG and the MISR, and an expected value of the value output from the MISR.

SUMMARY

In order to achieve a functional safety that complies with ISO 26262, i.e., the international standard for functional safety of vehicle-mounted instruments, a Power-on Self-Test (POST) is required. In the POST, a test on a logical portion is performed in the LBIST due to the limitation in the amount of test data. Since the test is performed upon application of random patterns in the LBIST, it is highly likely that a large number of failures in the circuit may not be detected. Therefore, a test point circuit is typically inserted (Test Point Insertion: TPI) in order to increase the probability that the failure in the circuit is detected when random numbers are applied. In the LBIST, the TPI needs to be performed a large number of times in order to increase the fault coverage, which causes an increase in an area overhead (hereinafter this will be referred to as an area OH). Further, since there is a limitation in regard to an execution time of the POST, it is required to increase the fault coverage while reducing the test time.

The other problems of the related art and the novel characteristics of the present invention will be made apparent from the descriptions of the specification and the accompanying drawings.

According to one embodiment, a test point circuit constitutes a scan chain, and captures, in one capture operation period of a clock sequential test, a first operation result in a second capture clock that comes after a first capture clock, the first operation result having been captured by a test point circuit at a previous stage or a last stage of the scan chain in the first capture clock.

A method, a device, or a system used in place of the circuit according to the above embodiment, a program that causes a computer to execute some of the processing of this circuit and the like are effective as aspects of the present invention.

According to the embodiment, it is possible to decrease the number of test point circuits to be inserted necessary to accomplish the target fault coverage, whereby it is possible to suppress the increase in the area overhead and to reduce the test time.

BRIEF DESCRIPTION OF THE DRAWINGS

The above and other aspects, advantages and features will be more apparent from the following description of certain embodiments taken in conjunction with the accompanying drawings, in which:

FIG. 20 is a diagram showing a schematic configuration of the scan flip-flop for the sequential test;

FIG. 21 is a truth table of the scan flip-flop for the sequential test shown in FIG. 20;

FIG. 22 is a diagram showing another configuration of the scan flip-flop for the sequential test according to the fifth embodiment;

FIG. 27 is a truth table of the scan flip-flop for the sequential test shown in FIG. 26;

FIG. 28 is a diagram showing an operation waveform example of a semiconductor device in which the scan flip-flop for the sequential test shown in FIG. 24 or 26 is inserted;

FIG. 29 is a diagram showing an operation waveform example of the semiconductor device in which the scan flip-flop for the sequential test shown in FIG. 24 or 26 is inserted;

DETAILED DESCRIPTION

Figure 1:
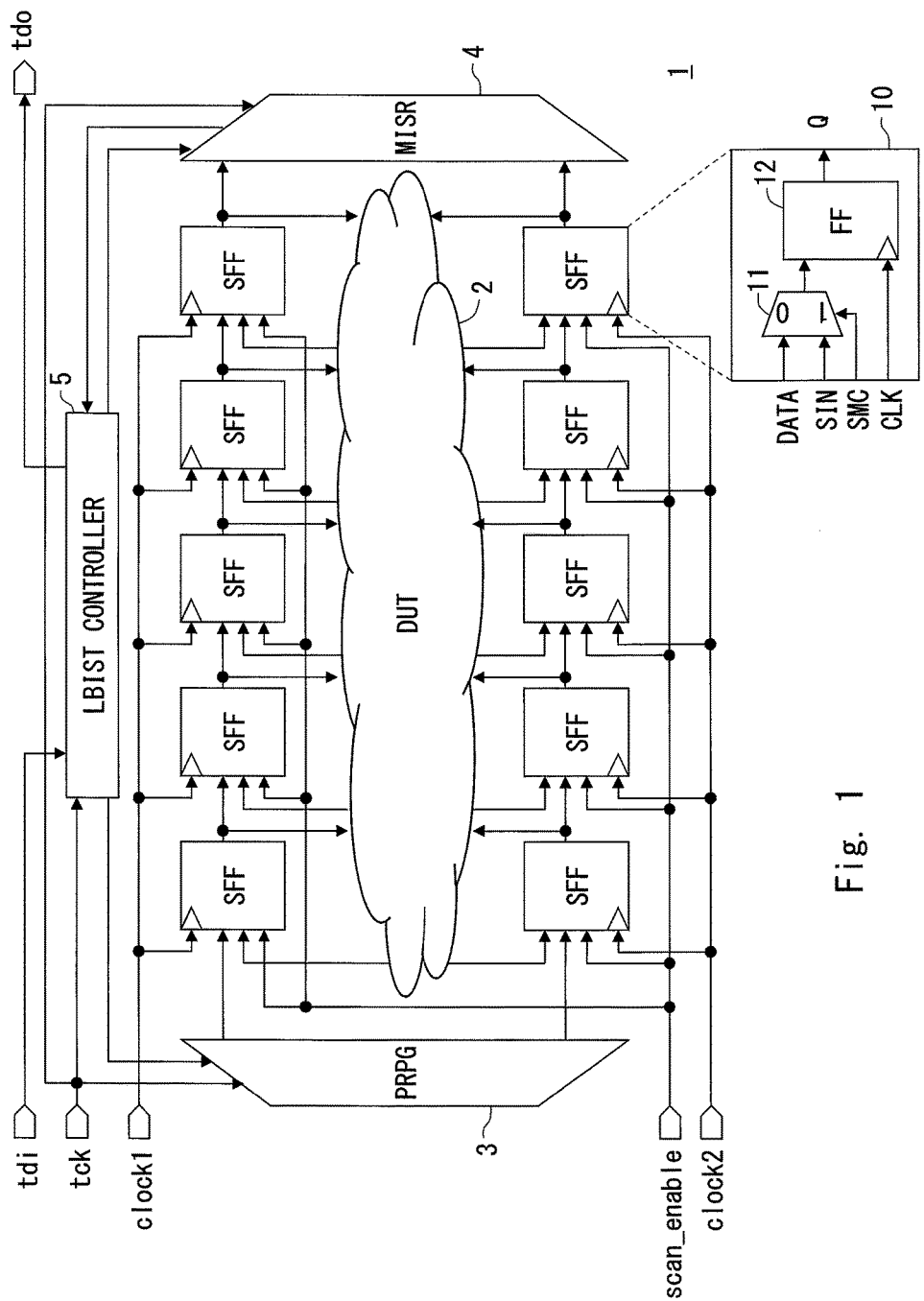
FIG. 1 is a diagram showing one example of a semiconductor device capable of executing an LBIST.

Embodiments of the present invention will be described below with reference to the accompanying drawings. For the clarification of the description, the following description and the drawings may be omitted or simplified as appropriate. The specific values and the like described in the following embodiments are merely examples to facilitate the understanding of the present invention and the present invention is not limited to them unless otherwise stated. Throughout the drawings, the same components are denoted by the same reference symbols and overlapping descriptions will be omitted as appropriate.

Further, each element shown in the drawings as functional blocks that perform various processing can be composed of a CPU, a memory, and other circuits in hardware and may be implemented by programs loaded in the memory in software. Those skilled in the art will therefore understand that these functional blocks may be implemented in various ways by only hardware, only software, or the combination thereof without any limitation.

The embodiments relate to a semiconductor device capable of executing a logic built-in self test (LBIST), and a test point circuit and a design device of the semiconductor device used therefor. First, with reference to FIG. 1, the semiconductor device capable of executing the LBIST will be described. FIG. 1 is a diagram showing one example of the semiconductor device capable of executing the LBIST. In the following description, a combination circuit to be tested will be referred to as a Design Under Test (DUT).

As shown in FIG. 1, a semiconductor device 1 includes a DUT 2, a pseudo random pattern generator (hereinafter this will be referred to as a PRPG) 3, a response compressor (Multiple Input Signature Register: hereinafter this will be referred to as an MISR) 4, an LBIST controller 5, and scan flip-flops (hereinafter they will be referred to as SFFs) 10.

In the semiconductor device 1, the plurality of SFFs 10 are connected in serial, whereby a plurality of scan chains are constructed. In the example shown in FIG. 1, five of the SFFs 10 are connected in one scan chain. The SFF 10 is a scan flip-flop for shifting capable of switching a scan shift operation and a capture operation. The SFF 10 includes a multiplexer (MUX) 11, a flip-flop (FF) 12, a data input terminal DATA, a scan-in terminal SIN, a control input terminal SMC, a clock terminal CLK, and a data output terminal Q.

The MUX 11 receives a test signal input through the scan-in terminal SIN and an operation result from the DUT 2 input through the data input terminal DATA. The MUX 11 switches the scan shift operation and the capture operation according to a scan enable signal input through the control input terminal SMC (scan-enable). That is, the scan enable signal is a control signal that switches the scan shift operation and the capture operation.

In the example shown in FIG. 1, when the scan enable signal is high (1), the scan-in terminal SIN becomes active. Further, when the scan enable signal is low (0), the data input terminal DATA becomes active. The FF 12 captures the value output from the MUX 11 according to a clock signal input through the clock terminal CLK (clock1 or clock2) and outputs the captured value to the scan-in terminal SIN of the subsequent SFF 10 from the data output terminal Q. While the example in which the clock signals supplied to the respective scan chains are different from one another is shown in FIG. 1, the same clock signal may be supplied to the respective scan chains.

The PRPG 3 is connected to the input side of the plurality of scan chains. The PRPG 3 generates a load data (test signal) in the LBIST and supplies the load data (test signal) to the scan chains. The SFF 10 outputs the test signal input through the scan-in terminal SIN to the subsequent SFF 10 in a scan shift operation period. The scan chain is subjected to the shift operation, whereby arbitrary test patterns are set in the respective SFFs 10.

In the capture operation, the value set in each of the SFFs 10 in the shift operation period is supplied to the DUT 2 and the operation result in the DUT 2 is captured by each of the SFFs 10. The MISR 4 is connected to the output side of the plurality of scan chains. The MISR 4 compresses unload data from the plurality of scan chains after the capture operation. The result of the compression is called a "signature". Further, the signature compressed by the MISR 4 is compared with an expected value by a control circuit in the circuit in the POST operation and by an external tester when a manufactured product is tested, whereby the presence or the absence of a failure is determined.

The LBIST controller 5 is connected to the PRPG 3 and the MISR 4. A clock signal tck is supplied to each of the LBIST controller 5, the PRPG 3, and the MISR 4. The LBIST controller 5 supplies an initial value to the PRPG 3. The PRPG 3 generates the load data based on the initial value supplied from the LBIST controller 5 in synchronization with the clock signal tck. The initial value of the PRPG 3 can be arbitrarily rewritten by a test data input signal tdi supplied from an external device.

Further, the LBIST controller 5 outputs the result of the compression performed by the MISR 4 to the external tester as a test data output signal tdo. By comparing the result of the compression with an expected value by the external tester after the test has been executed for a desired period of time, the presence or the absence of the failure of the DUT is determined.

A test point circuit is inserted in the semiconductor device 1 to increase the probability that the failure in the circuit is detected when random numbers are applied. The test point circuit is a logic circuit that is inserted in order to improve the controllability and the observability of signal lines and terminals in a circuit to be tested.

The "controllability" is a measure indicating how readily the internal state of the DUT can be controlled from the external terminal. Specifically, the "controllability" means the minimum value of the number of signal lines in which logical values need to be set in order to make the value of a signal line or a terminal included in the DUT be 0 or 1. The "observability" is a measure indicating how readily the internal state of the DUT can be observed in the external terminal. Specifically, the "observability" is the minimum value of the number of signal lines in which logical values need to be set in order to propagate a signal to an observation point.

By inserting the test point circuit in the circuit to be tested, it is possible to increase the fault coverage in the DUT when random numbers are applied in the LBIST. The test point circuit that is inserted for the purpose of improving the controllability will be referred to as a control test point circuit. The control test point circuit is a logic circuit that serves as a control point at which the value of the signal line in the DUT can be set to 0 or 1. The control test point circuit includes, for example, a combination circuit such as an AND gate, an OR gate and the like, an external input terminal, and a flip-flop.

Further, the test point circuit that is inserted in order to improve the observability is an observation test point circuit. The observation test point circuit serves as an observation point at which the operation result of the DUT can be observed. The observation test point circuit corresponds to an external output terminal or the SFF. In the following description, the test point may be abbreviated as TP. Further, the insertion of the TP circuit into the signal line of the DUT for the purpose of improving the testability may be abbreviated as a Test Point Insertion (TPI).

Figure 2:
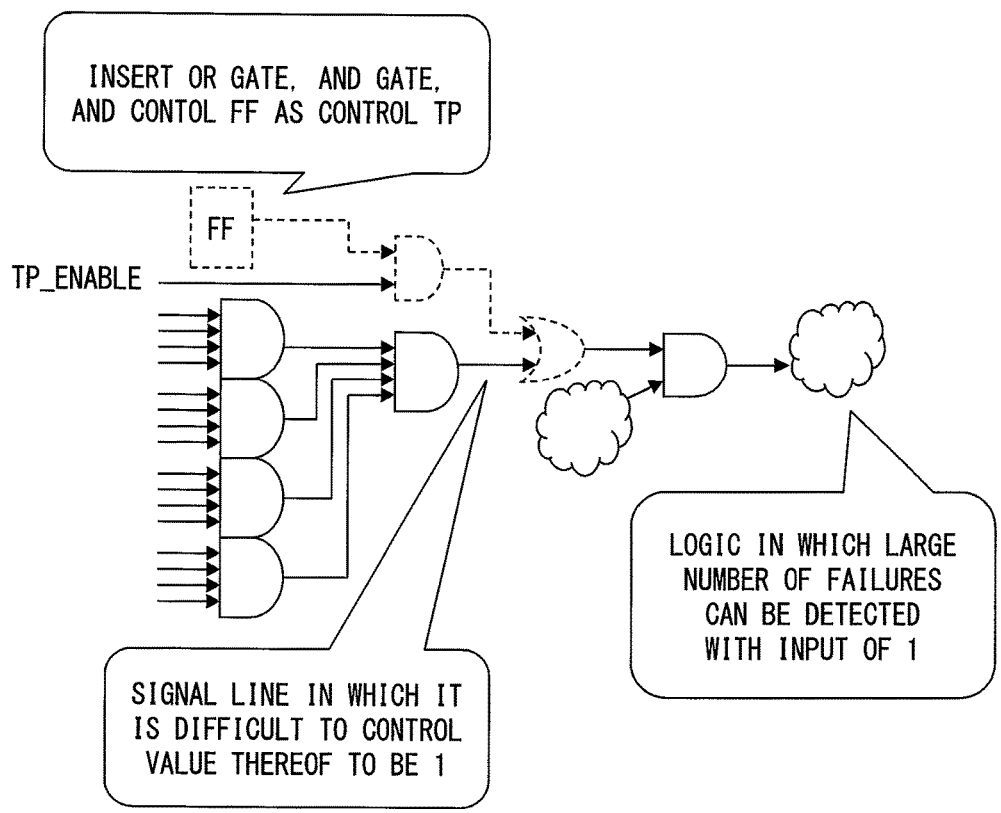
FIG. 2 is a diagram for describing an insertion of a control test point circuit.

FIG. 2 is a diagram for describing the insertion of the control TP circuit. In the example shown in FIG. 2, as shown by dashed lines, an AND gate, an OR gate, and a control ET are inserted into the signal line in which the probability that the value thereof is controlled to be 1 is low as the control TP circuit. By propagating the value from the control FF, the probability that the part in which the AND gate and the OR gate are inserted is set to 1 can be increased, whereby it is possible to improve the fault coverage.

Figure 3:
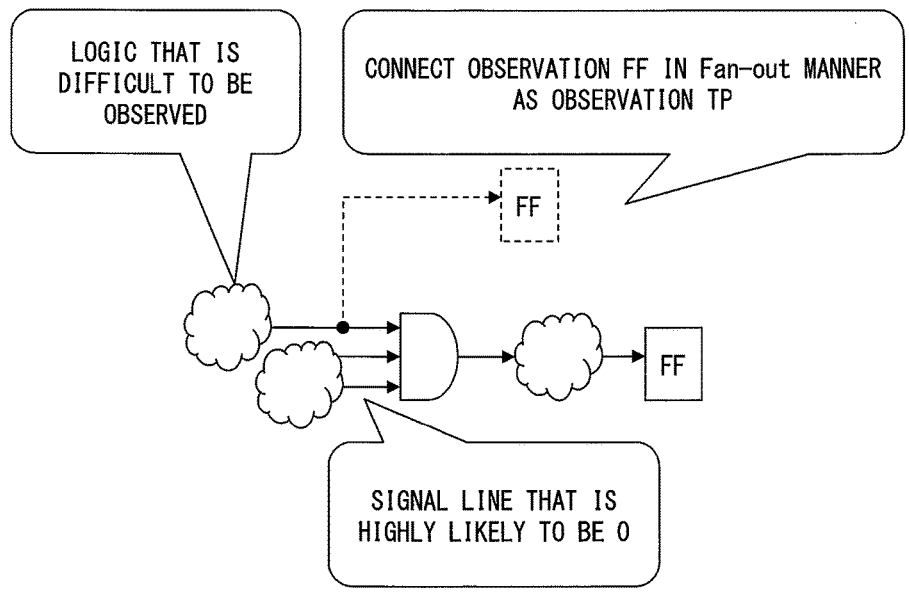
FIG. 3 is a diagram for describing an insertion of an observation test point circuit.

FIG. 3 is a diagram for describing the insertion of the observation TP circuit. In the example shown in FIG. 3, as shown by dashed lines, an observation FF is inserted into a part in which the probability that the failure is propagated to the end point FF is low as the observation TP circuit. By connecting the observation FT in a fan-out manner, the failure can be observed by the observation FF, whereby it is possible to improve the fault coverage.

As described above, the TPI needs to be performed a large number of times in order to improve the fault coverage in the LBIST, whereby the area OH increases. In view of this problem, the present inventors have invented a method of applying a clock sequential test (multi-cycle test) to the LBIST in order to reduce the number of TPs to be inserted or an LBIST execution time.

Figure 4:
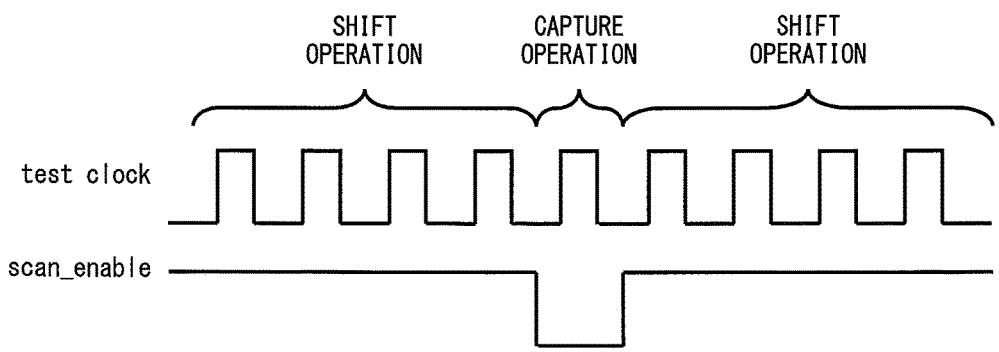
FIG. 4 is a diagram showing an operation waveform example of a scan test.

The clock sequential test is a scan test in which a plurality of capture clocks are input in one capture operation period and a response of the test signal by the DUT 2 is captured in the plurality of capture clocks. With reference to FIGS. 4 and 5, operation waveforms of the scan test in a single clock and the clock sequential test in a plurality of clocks will be described.

Figure 5:
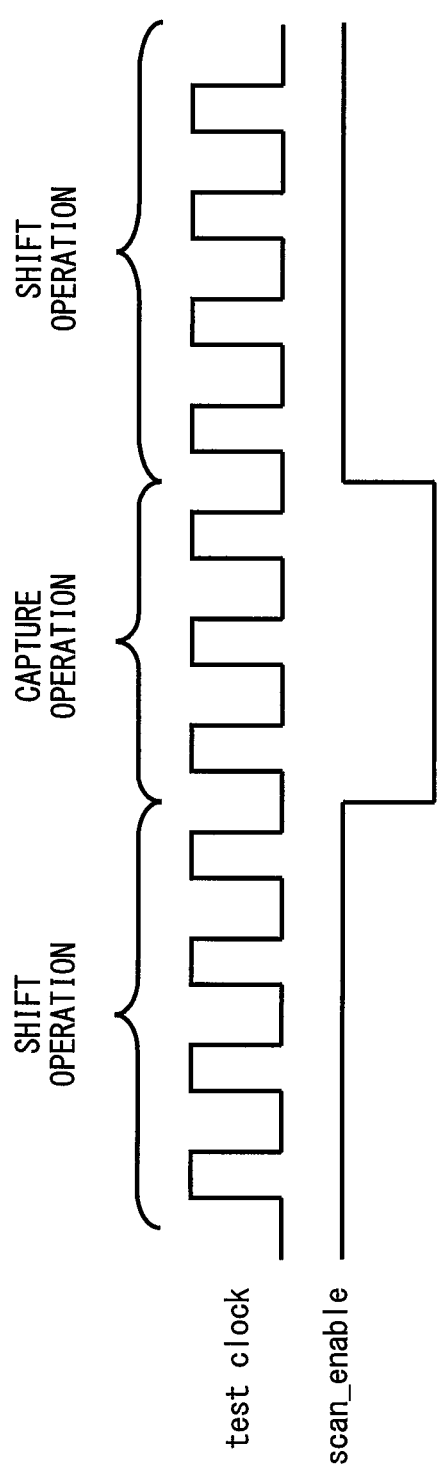
FIG. 5 is a diagram showing an operation waveform example of a clock sequential test.

In FIGS. 4 and 5, the shift of the test signal in the scan shift operation period and the capturing of the operation result in the capture operation period are performed in synchronization with clock edges of the test clock. In the following description, the test clock in the capture operation period is referred to as a "capture clock".

FIG. 4 is a diagram showing an operation waveform example of the scan test with respect to a single stuck-at fault model in which a single clock is applied in one capture operation period. When the scan enable signal is low (0), the operation result of the DUT 2 input through the data input terminal DATA is captured. In the example shown in FIG. 4, only one capture clock is input in one capture operation period.

FIG. 5 is a diagram showing an operation waveform example of the clock sequential test in which a plurality of clocks are applied in one capture operation period. In the example shown in FIG. 5, the capture clock is applied three times in one capture operation period. As shown in FIG. 5, similar to FIG. 4, when the scan enable signal is low (0), the operation result of the DUT 2 input through the data input terminal DATA is captured.

As described above, in the clock sequential test, it is possible to capture the operation result of the DUT 2 in the plurality of capture clocks in one capture operation period. It is therefore possible to widen the range in which the failure is activated in one capture operation period and to increase the number of failures that can be detected. It is therefore possible to reduce the number of TPs needed to be inserted in order to accomplish the target fault coverage or to reduce the LBIST execution time.

The observation FF used as the observation TP circuit described with reference to FIG. 3 has a configuration the same as that of the SFF described with reference to FIG. 1 and is not provided for the clock sequential test. The present inventors have invented a test point circuit for a clock sequential test in order to further improve the effect of the clock sequential test.

The test point circuit according to the embodiment constitutes the scan chain capable of executing the scan test of the LSI and performs the clock sequential test. The test point circuit according to the embodiment includes a logical structure capable of suppressing an increase in the area overhead due to the insertion of the test point and increasing the fault coverage while reducing the test time. Specifically, the test point circuit according to the embodiment captures, in one capture operation period of the clock sequential test, a first operation result that the previous test point circuit or the test point circuit at the last stage has captured in a first capture clock in a second capture clock that comes after the first capture clock.

The semiconductor device using the test point circuit according to this embodiment is applicable, for example, to products in which Power-on Self-Test (POST) that complies with International Standard ISO 26262 is implemented. Further, this semiconductor device is also applicable to products in which it is desired to reduce the testing cost when the LBIST is applied in a mass production test process or design devices (electronic design automation (EDA) tools) in which the LBIST is implemented and the like.

First Embodiment

Figure 6:
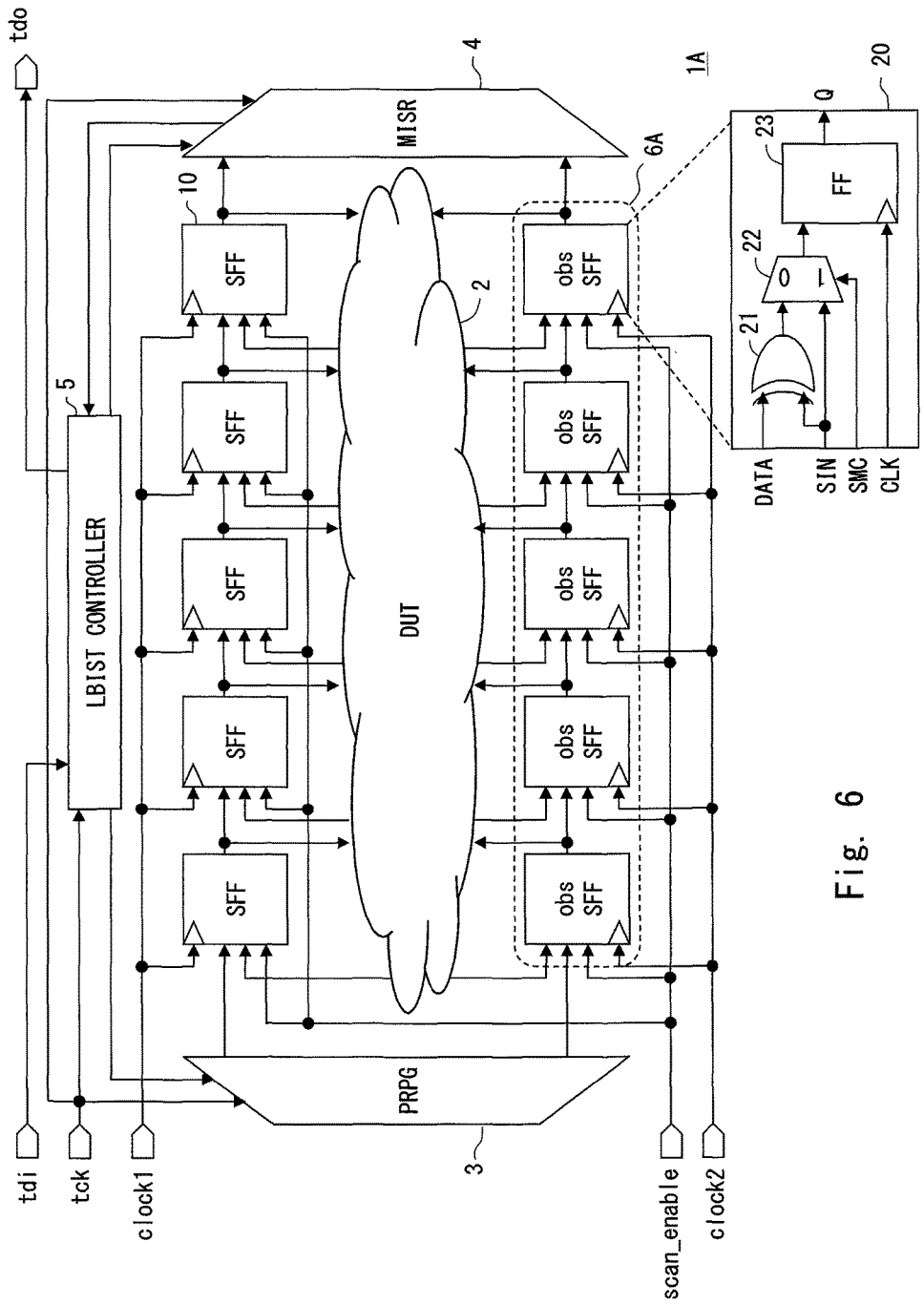
FIG. 6 is a diagram showing a configuration of a semiconductor device in which a test point circuit according to a first embodiment is inserted.

With reference to FIG. 6, a semiconductor device in which a test point circuit according to a first embodiment is inserted will be described. FIG. 6 is a diagram showing a configuration of a semiconductor device 1A according to the first embodiment. As shown in FIG. 6, the semiconductor device 1A includes a DUT 2, a. PRPG 3, an MISR 4, an LBIST controller 5, SFFs 10, and observation scan flip-flops (hereinafter they will be referred to as observation SFFs) 20. In FIG. 6, the observation SFFs 20 are shown as obsSFF. Since the configurations other than the observation SFFs 20 are the same as those described in FIG. 1, detailed descriptions thereof will be omitted.

A plurality of scan chains are constructed in the semiconductor device 1A. At least one of the plurality of scan chains is composed of only the observation SFFs 20. In the example shown in FIG. 6, one scan chain is composed of only the observation SFFs 20 and the remaining scan chains are composed of the SFFs 10. The scan chain composed of the SFFs 10 is constituted separately from the scan chain composed of only the observation SFFs 20.

In FIG. 6, the scan chain composed of the observation SFFs 20 is shown as a scan chain 6A. In the scan chain 6A, five observation SFFs 20 are connected in serial. In each of the other scan chains, five SFFs 10 are connected in serial.

The observation SFF 20 is an observation test point circuit inserted for the purpose of improving the observability which brings an efficiency improvement effect in the clock sequential test. The observation SFF 20 is inserted in the DUT 2 that outputs the operation result in accordance with the test signal that is scanned in. The observation SFF 20 includes an XOR gate 21, an MUX 22, an FF 23, a data input terminal DATA, a scan-in terminal SIN, a control input terminal SMC, a clock terminal CLK, and a data output terminal Q. That is, the observation SFF 20 has an input/output configuration similar to that of the SFF 10.

The output of the observation SFF 20 is connected to the scan-in terminal SIN of the subsequent observation SFF 20, whereby the scan chain 6A is constituted. The observation SFF 20 is able to switch the scan shift operation and the capture operation.

The observation SFF 20 captures, in one capture operation period, the operation result from the DUT 2 in each of the plurality of capture clocks. For example, the first capture clock applied in one capture operation period is denoted by a first capture clock and the capture clock that follows the first capture clock is denoted by a second capture clock. Further, the operation result from the DUT 2 captured in the first capture clock is denoted by a first operation result. The period in which one capture clock pulse operation is performed in one capture operation period is referred to as a capture cycle.

Note that the first capture clock may not be a capture clock that is applied first in one capture operation period and may be a capture clock that is applied after that. The second capture clock may be a capture clock that is applied after the first capture clock in one capture operation period.

The operation result from the DUT 2 is input to the data input terminal DATA in the capture operation period. The test signal is input to the scan-in terminal SIN in the scan shift operation period and the first operation result that the previous observation SFF 20 of the scan chain has captured in the first capture clock is input to the scan-in terminal SIN in the capture operation period.

The XOR gate 21 receives the signal input through the scan-in terminal SIN and the signal input through the data input terminal DATA. Further, the XOR gate 21 outputs the exclusive OR of the operation result from the DUT 2 input through the data input terminal DATA and the first operation result input through the scan-in terminal SIN that the previous observation SFF 20 of the scan chain has captured in the first capture clock.

The MUX 22 receives the signal input through the scan-in terminal SIN and the signal output from the XOR gate 21. The MUX 22 switches the scan shift operation and the capture operation according to the scan enable signal input through the control input terminal SMC. In the example shown in FIG. 6, the MUX 22 is in the scan shift operation when the scan enable signal is high (1) and the input through the scan-in terminal SIN becomes valid. Further, the MUX 22 is in the capture operation when the scan enable signal is low (0) and the output from the XOR gate 21 becomes valid.

The FF 23 captures the value output from the MUX 22 according to the clock signal input through the clock terminal CLK (clock2) and outputs the captured value to the scan-in terminal SIN of the subsequent observation SFF 20 from the data output terminal Q. In the scan shift operation period, the FF 23 captures the test signal. Further, in the capture operation period, the FF 23 captures the exclusive OR that the MUX 22 outputs in the second capture clock that comes after the first capture clock. That is, the first operation result that the previous observation SFF 20 of the scan chain 6A has captured in the first capture clock is propagated to the subsequent observation SFF 20 in the second capture clock that comes after the first capture clock.

If the scan chain is composed of the SFFs 10 in place of the observation SFFs 20 in FIG. 6, in the clock sequential test, the operation result that has reached the data input terminal DATA of the observation SFF 20 in the first capture clock is propagated to nowhere in the next second capture clock and disappears.

On the other hand, in the semiconductor device 1A according to the first embodiment, the operation result that has reached the observation SFF 20 in the first capture clock in one capture operation period is propagated to the subsequent observation SFF 20 on the scan chain 6A via the XOR gate 21 in the next second capture clock. As described above, in the semiconductor device 1A, it is possible to increase the probability that the operation result that has reached the observation SFF 20 can be accumulated in the next observation SFF 20 of the scan chain 6A without causing the operation result to disappear in the next capture cycle.

Further, the observation SFF 20 is able to store the operation result that has reached the previous observation SFF 20 and to capture the operation result from the DUT 2 via the XOR gate 21 from the data input terminal DATA of the observation SFF 20 in each capture cycle. Therefore, when the capture clock is applied a plurality of times in one capture operation period, the number of failures that can be detected increases. It is therefore possible to reduce the number of TPs to be inserted required to accomplish the target fault coverage. It is therefore possible to suppress the increase in the area overhead.

Further, by executing the clock sequential test in the semiconductor device 1A of FIG. 6, a large number of failures can be detected in one capture operation period, whereby it is possible to reduce the test time. Since the scan shift operation time accounts for the most of the test time in the scan test, even when the number of capture clocks in the capture operation period is increased, this has little influence on the test time.

Figure 7:
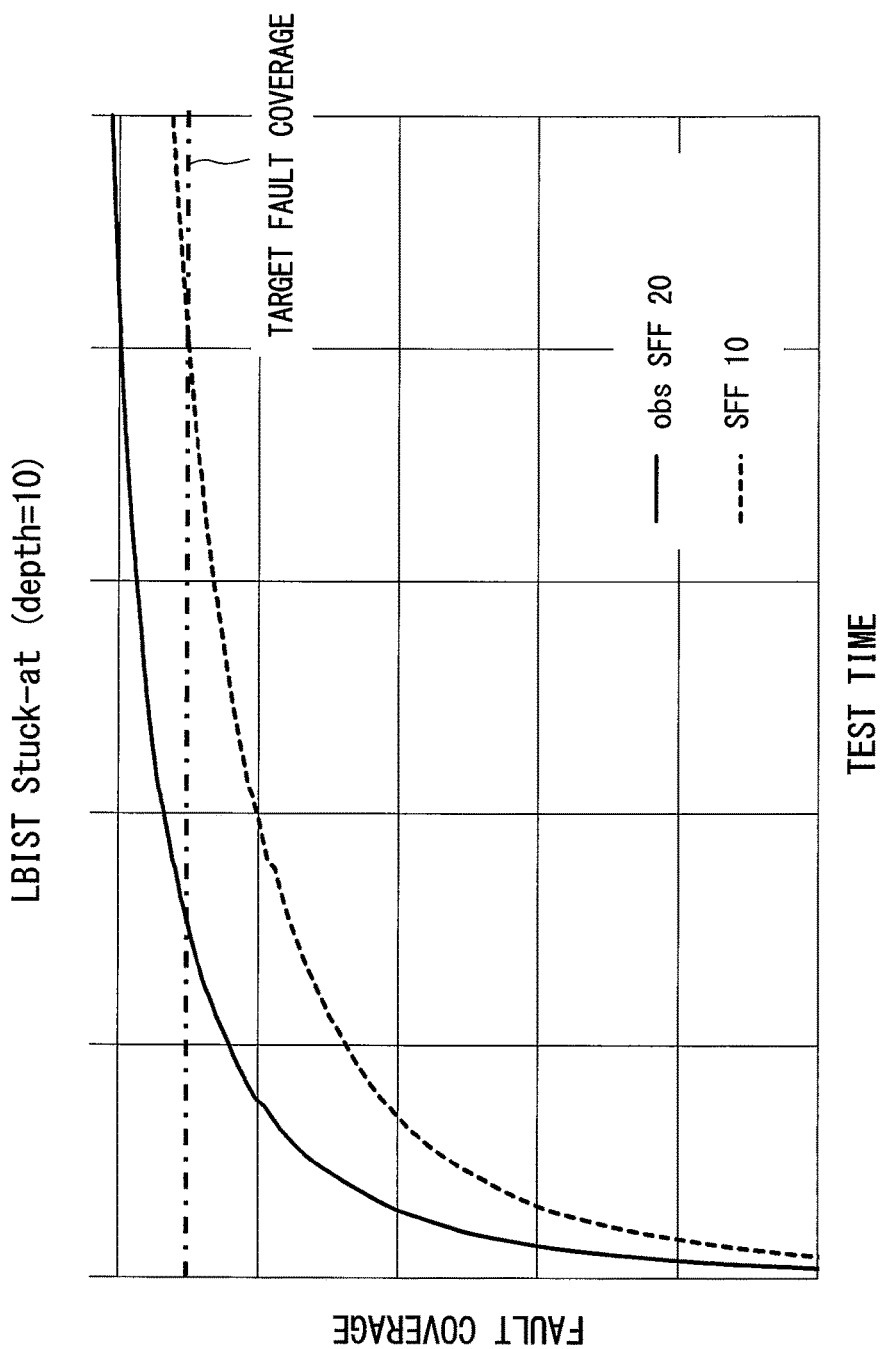
FIG. 7 is a diagram showing a fault coverage with respect to a scan test time of the semiconductor device according to the first embodiment.

With reference to FIG. 7, an effect of reducing the test time will be described. FIG. 7 is a diagram showing the fault coverage with respect to the test time. In FIG. 7, the horizontal axis indicates the test time and the vertical axis indicates the fault coverage. Further, in FIG. 7, the solid line indicates the result of the semiconductor device 1A using the observation SFFs 20 according to the embodiment and the dashed line indicates the result of the semiconductor device when the scan chain is composed of the SFFs 10 in place of the observation SFFs 20 of FIG. 6.

In the example shown in FIG. 7, the clock sequential test in which the capture clock is applied ten times in one capture operation period has been applied. As shown in FIG. 7, compared to the case in which the SFFs 10 are used, the test time required to accomplish the target fault coverage can be suppressed to half or less by using the observation SFFs 20.

As described above, according to the embodiment, by forming the scan chain by the observation SFFs 20, it is possible to improve the efficiency of the clock sequential test in a low area OH without adding a special test circuit.

While the semiconductor device 1A shown in FIG. 6 is able to execute the LBIST and the PRPG 3 and the MISR 4 are implemented in the semiconductor device 1A, the present invention is not limited to this example. While the clock sequential test is highly effective in the LBIST, in particular, in that it is possible to reduce the number of TPs to be inserted or to reduce the LBIST execution time, it provides a certain effect also in the compression scan.

The compression scan is one example of a design for testability (DFT) that reduces the amount of test data. In the compression scan, the scan chains whose number is greater than that of the external terminals are constructed inside, whereby the number of SFFs for each scan chain is reduced. Then the value supplied from the external input terminal is expanded for the number corresponding to the number of scan chains included inside via a decompressor, and the test pattern is applied to the respective scan FFs. Further, the output from the scan chain is compressed by the compressor and is observed in the external output terminal.

In the compression scan, configuration values (care bits) of the scan FFs necessary for the detection of the failure may be supplied with a small number of shift cycles and the respective scan FFs may be observed with a small number of shift cycles. It is therefore possible to increase the number of failures to be detected for one bit of the external input/output terminal and to reduce the amount of test data. The observation SFFs 20 according to this embodiment can also be applied to a semiconductor device capable of executing a compression scan test.

In the semiconductor device capable of executing the compression scan, a decompressor and a compressor that can be controlled and observed from outside are connected in place of the PRPG 3 and the MISR 4 shown in FIG. 6. The semiconductor device capable of executing the compression scan may also have a configuration similar to the configuration shown in FIG. 6, whereby it is possible to improve the efficiency of the clock sequential test.

While the clock signal supplied to the scan chain 6A (clock2) and the clock signal supplied to the other scan chains (clock1) are different from each other in the example shown in FIG. 6, they may be the same. That is, the scan chain composed of the SFFs 10 and the scan chain composed of the observation SFFs 20 may be clock domains different from each other or may be the same clock domain.

Figure 8:
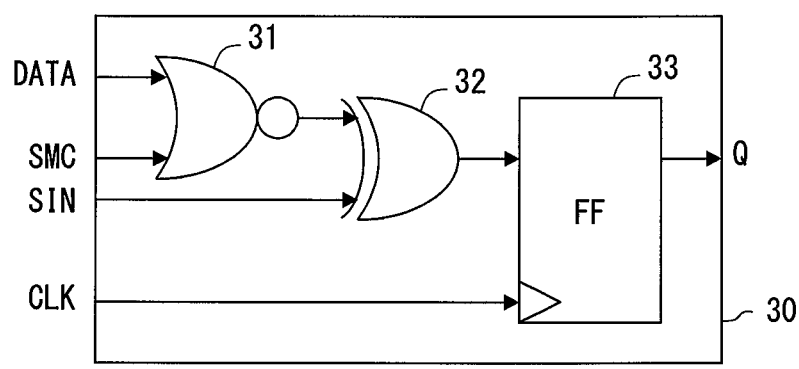
FIG. 8 is a diagram showing another configuration of the test point circuit according to the first embodiment.

FIG. 8 shows another example of the observation SFF 20. FIG. 8 is a diagram showing a configuration of another test point circuit 30 according to the first embodiment. The observation SFF 30 is used in place of the observation SFF 20 of the semiconductor device 1A shown in FIG. 6. As shown in FIG. 8, the observation SFF 30 includes a NOR gate 31, an XOR gate 32, an FF 33, a data input terminal DATA, a scan-in terminal SIN, a control input terminal SMC, a clock terminal CLK, and a data output terminal Q.

Similar to the scan chain 6A shown in FIG. 6, a plurality of observation SFFs 30 form one scan chain. Further, at least one of the plurality of scan chains in the semiconductor device 1A is composed of only the observation SFFs 30.

Similar to the observation SFF 20, the observation SFF 30 captures the operation result from the DUT 2 in each of the plurality of capture clocks in one capture operation period. The operation result from the DUT 2 is input to the data input terminal DATA in the capture operation period. The test signal is input to the scan-in terminal SIN in the scan shift operation period and the first operation result that the previous observation SFF 20 of the scan chain has captured in the first capture clock is input to the scan-in terminal SIN in the capture operation period.

The scan enable signal, which is a control signal that switches the scan shift operation and the capture operation, is input to the control input terminal SMC. The NOR gate 31 receives the scan enable signal input through the control input terminal SMC and the signal input through the data input terminal DATA and outputs the negative OR in the capture operation period. The XOR gate 32 receives the first operation result input to the scan-in terminal SIN and the negative OR from the NOR gate 31 and outputs the exclusive OR thereof.

The FF 33 captures the value output from the XOR gate 32 according to the clock signal input through the clock terminal CLK and outputs the captured value to the scan-in terminal SIN of the subsequent observation SFF 20 from the data output terminal Q. In the capture operation period, the FF 33 captures the exclusive OR output from the XOR gate 32 in the second capture clock that comes after the first capture clock.

In the scan shift operation period (scan enable signal=1), the value of the data input terminal DATA is interrupted and the test signal input through the scan-in terminal SIN is captured by the FF 33. In the capture operation period (scan enable signal=0), the value of the data input terminal DATA is inverted and passes through. The XOR gate 32 receives the value obtained by inverting the value of the data input terminal DATA and the value of the scan-in terminal SIN. The FF 33 captures the output value of the XOR gate 32 according to the clock terminal CLK. The FF 33 of the observation SFF 30 has a function similar to that of the FF 23 of the observation SFF 20 except that the captured value is inverted.

When the observation SFF 30 is used, in the capture operation period, the value obtained by inverting the value input through the data input terminal DATA is captured by the FF 33 via the XOR gate 32. Even in the case in which the inverted value of the input of the data input terminal DATA is captured by the observation SFF 30, this has no influence on the scan test operation and the normal user operation.

In the clock sequential test, the first operation result that the previous observation SFF 20 of the scan chain 6A has captured in the first capture clock is propagated to the subsequent observation SFF 20 in the second capture clock that comes after the first capture clock. It is therefore possible to improve the efficiency of the clock sequential test in the low area OH. Further, the area of the circuit and the delay in the observation SFF 30 are smaller than those in the observation SFF 20. Therefore, by using the observation SFF 30 as the observation test point circuit, it is possible to further reduce the area OH and to suppress the increase in the operation speed.

Second Embodiment

Figure 9:
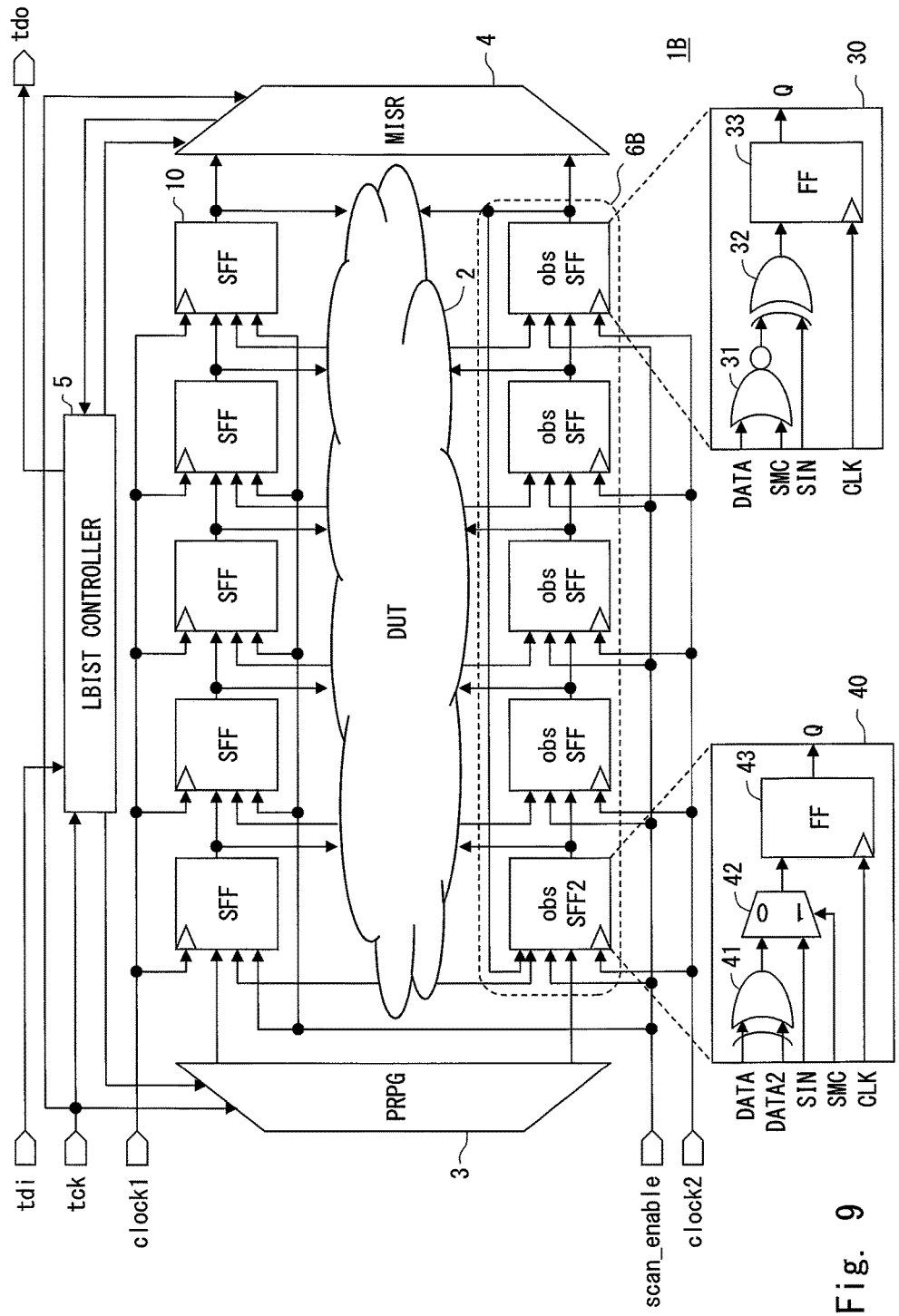
FIG. 9 is a diagram showing a configuration of a semiconductor device in which a test point circuit according to a second embodiment is inserted.

With reference to FIG. 9, a semiconductor device in which a test point circuit according to a second embodiment is inserted will be described. FIG. 9 is a diagram showing a configuration of a semiconductor device 1B according to the second embodiment. As shown in FIG. 9, the semiconductor device 1B includes a DUT 2, a PRPG 3, an MISR 4, an LBIST controller 5, SFFs 10, observation SFFs 30, and an observation SFF 40. The observation SFFs 30 and the observation SFF 40 are observation test point circuits that are inserted for the purpose of improving the observability and that give an efficiency improvement effect of the clock sequential test. In FIG. 9, the observation SFFs 30 are indicated by obsSFFs and the observation SFF 40 is indicated by obsSFF 2.

In the semiconductor device 1B, at least one of the plurality of scan chains is composed of the observation SFFs 30 and the observation SFF 40. In the example shown in FIG. 6, one scan chain is composed of the observation SFFs 30 and the observation SFF 40 and the other scan chains are composed of the SFFs 10. In FIG. 9, the scan chain composed of the observation SFFs 30 and the observation SFF 40 is indicated by a scan chain 6B.

In the scan chain 6B, the observation SFF 40 is connected in the first stage and four observation SFFs 30 are connected in serial after the observation SFF 40. The observation SFFs 30 may have the configuration shown in FIG. 8. While the observation SFFs 30 are used in the example shown in FIG. 9, the observation SFFs 20 shown in FIG. 6 may be used in place of the observation SFFs 30. That is, in the scan chain 6B, the observation SFF 40 and the four observation SFFs 20 may be connected in serial. While the configurations other than the observation SFFs 30 and the observation SFF 40 are the same as those described in FIG. 6, detailed descriptions thereof will be omitted.

The output of the observation SFF 40 is connected to the scan-in terminal SIN of the observation SFF 30. Further, the output of the observation SFF 30 is connected to the scan-in terminal SIN terminal of the subsequent observation SFF 30, whereby the scan chain 6B is constituted. The output of the observation SFF at the last stage is connected to a data input terminal DATA2 of the observation SFF 40. Both the observation SFF 40 and the observation SFF 30 are able to switch the scan shift operation and the capture operation. The observation SFF 40 is able to capture, similar to the observation SFF 30, the operation result from the DUT 2 in each of the plurality of capture clocks in one capture operation period.

In the semiconductor device 1B according to the second embodiment, in the clock sequential test, the failure that has propagated to the observation SFF 30 at the last stage can be held on the scan chain 6B. As shown in FIG. 9, the observation SFF 40 includes an XOR gate 41, an MUX 42, an FF 43, a data input terminal DATA, a data input terminal DATA2, a scan-in terminal SIN, a control input terminal SMC, a clock terminal CLK, and a data output terminal Q.

The test signal is input to the scan-in terminal SIN in the scan shift operation period. The operation result from the DUT 2 is input to the data input terminal DATA in the capture operation period. Further, in the capture operation period, the first operation result that the observation SFF 30 at the last stage has captured in the first capture clock is input to the data input terminal DATA2. That is, the observation SFF 40 includes data input terminals having two systems.

The XOR gate 41 receives the signal input through the data input terminal DATA and the signal input through the data input terminal DATA2. The XOR gate 41 outputs the exclusive OR of the operation result from the DUT 2 input through the data input terminal DATA and the first operation result input through the data input terminal DATA2 that the observation SFF 30 at the last stage of the scan chain has captured in the first capture clock.

The MUX 42 receives the signal input through the scan-in terminal SIN and the signal output from the XOR gate 41. The MUX 42 switches the scan shift operation and the capture operation according to the scan enable signal input through the control input terminal SMC. In the example shown in FIG. 9, the MUX 42 is in the scan shift operation when the scan enable signal is high (1) and the input through the scan-in terminal SIN becomes valid. Further, the MUX 42 is in the capture operation when the scan enable signal is low (0) and the output from the XOR gate 41 becomes valid.

The FF 43 captures the value output from the MUX 42 according to the clock signal input through the clock terminal CLK (clock2) and outputs the captured value to the scan-in terminal SIN of the subsequent observation SFF 30 from the data output terminal Q.

In the scan shift operation period (scan enable signal=1), the FF 43 captures the test signal input through the scan-in terminal SIN. Further, in the capture operation period (scan enable signal=0), the FF 43 captures the exclusive OR of two data input terminals (DATA, DATA2) in the second capture clock that comes after the first capture clock. That is, the first operation result that the observation SFF 30 at the last stage of the scan chain 6B has captured in the first capture clock is propagated to the observation SFF 20 at the first stage in the second capture clock that comes after the first capture clock.

As described above, according to the semiconductor device 1B according to the second embodiment, even when the capture clock is applied a plurality of times in one capture operation period in the clock sequential test, the failure captured by the observation SFF 30 at the last stage of the scan chain 6B in one capture clock is propagated to the observation SFF 40 at the first stage in the next capture clock and the failure does not disappear.

For the convenience of the circuit configuration, in the clock sequential test, the MISR 4 may not be used in the capture operation period and the failure may not be observed in the external tester via the compressor. In such a case, the operation result captured by the observation SFF 30 at the last stage is propagated to nowhere when the next capture clock is output and disappears.

As described in the second embodiment, when the circuit configuration shown in FIG. 9 is employed, the operation result captured by the observation SFF 30 at the last stage can be propagated to the observation SFF 40 at the first stage in the capture clock in the next capture cycle, whereby it is possible to prevent the operation result from being disappeared.

In the scan chain 6B, each of the observation SFFs 30 connected after the observation SFF 40 captures the first operation result that the previous observation SFF 40 or the observation SFF 30 has captured in the first capture clock in the second capture clock, as described in the first embodiment. It is therefore possible to increase the number of failures that can be detected in one capture operation of the clock sequential test compared to that in the first embodiment. As a result, it is possible to reduce the number of TPs to be inserted necessary to accomplish the target fault coverage or to reduce the LBIST execution time.

Third Embodiment

Figure 10:
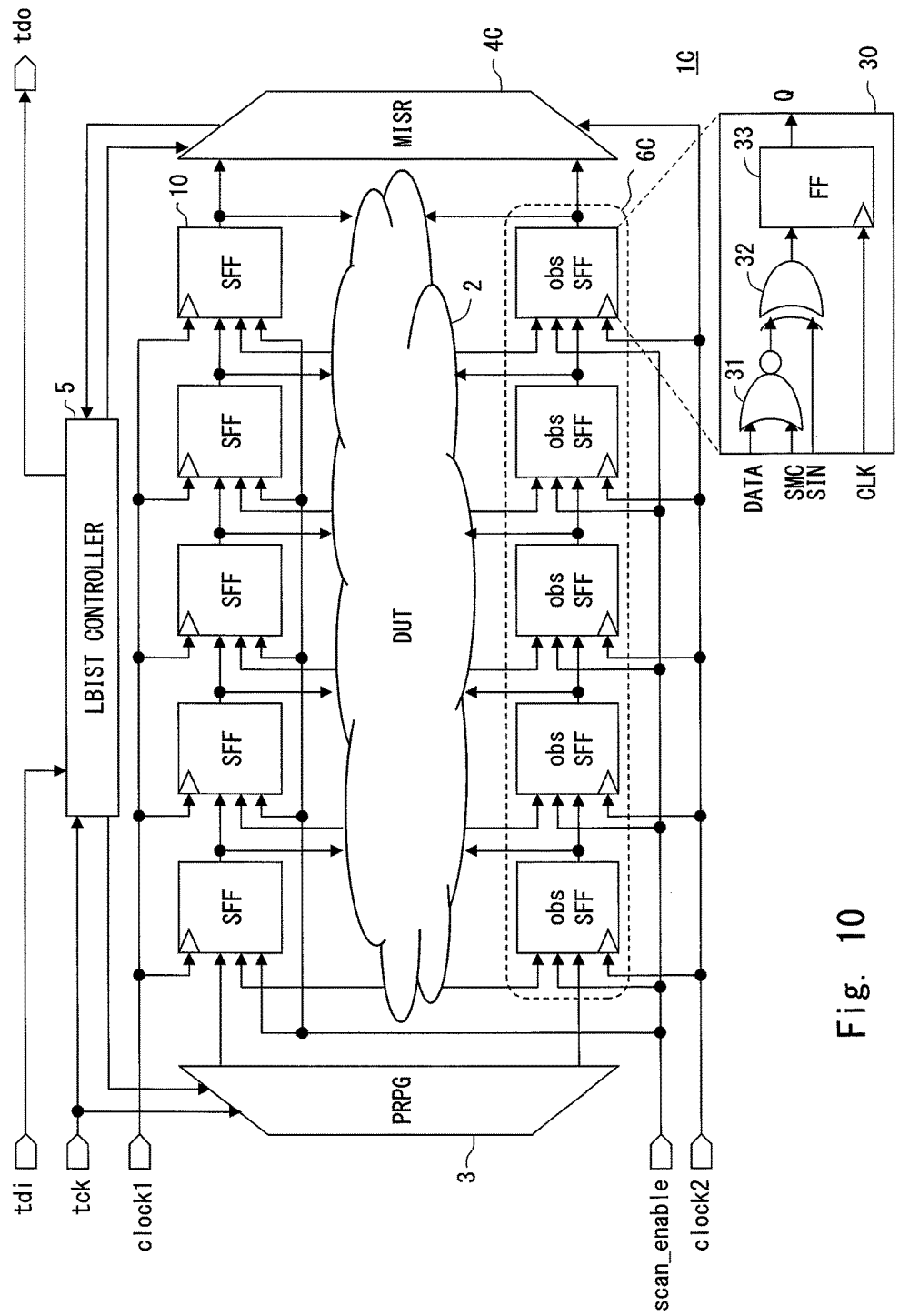
FIG. 10 is a diagram showing a configuration of a semiconductor device in which a test point circuit according to a third embodiment is inserted.

With reference to FIG. 10, a semiconductor device in which a test point circuit according to a third embodiment is inserted will be described. FIG. 10 is a diagram showing a configuration of a semiconductor device 1C according to the third embodiment. As shown in FIG. 10, the semiconductor device 1C includes a DUT 2, a PRPG 3, an MISR 4C, an LBIST controller 5, SFFs 10, and observation SFFs 30. In the semiconductor device 1C, in the clock sequential test, the failure propagated to the observation SFF 30 at the last stage can be held by the MISR 4C.

In the semiconductor device 1C, at least one of the plurality of scan chains is composed of only the observation SFFs 30. In the example shown in FIG. 6, one scan chain is composed of only the observation SFFs 30 and the other scan chains are composed of the SFFs 10. In FIG. 10, the scan chain composed of only the observation SFFs 30 is shown by a scan chain 6C.

In the scan chain 6C, five observation SFFs 30 are connected in serial. The observation SFFs 30 have the configuration the same as that shown in FIG. 8. While the observation SFFs 30 are used in the example shown in FIG. 10, the observation SFFs 20 shown in FIG. 6 may be used in place of the observation SFFs 30.

In the capture operation period (scan enable signal=0), the first operation result that the observation SFF 30 at the last stage of the scan chain 6C has captured in the first capture clock is propagated to the MISR 4C in the second capture clock that comes after the first capture clock. In the example shown in FIG. 10, the clock signal (clock2) is input to the MISR 4. The MISR 4C captures the value output from the observation SFF 30 at the last stage in synchronization with the clock signal (clock2).

The MISR 4C compresses the unload data from the plurality of scan chains after the capture operation and generates the signature. At the same time, the MISR 4C is able to perform the compression operation by capturing the value of the observation SFF 30 at the last stage during the capture operation period. That is, the MISR 4C is able to capture the output value of the observation SFF 30 at the final stage for each capture cycle not only in the shift period but also when the capture clock is applied a plurality of times in the clock sequential test.

As described above, in each capture cycle, the failure that has reached the observation SFF 30 at the last stage can be captured by the MISR 4C, whereby the failure can be observed without causing the failure to disappear. It is therefore possible to increase the number of failures that can be detected during one capture operation period of the clock sequential test and to reduce the number of TPs to be inserted necessary to accomplish the target fault coverage or to reduce the LBIST execution time.

Fourth Embodiment

Figure 11:
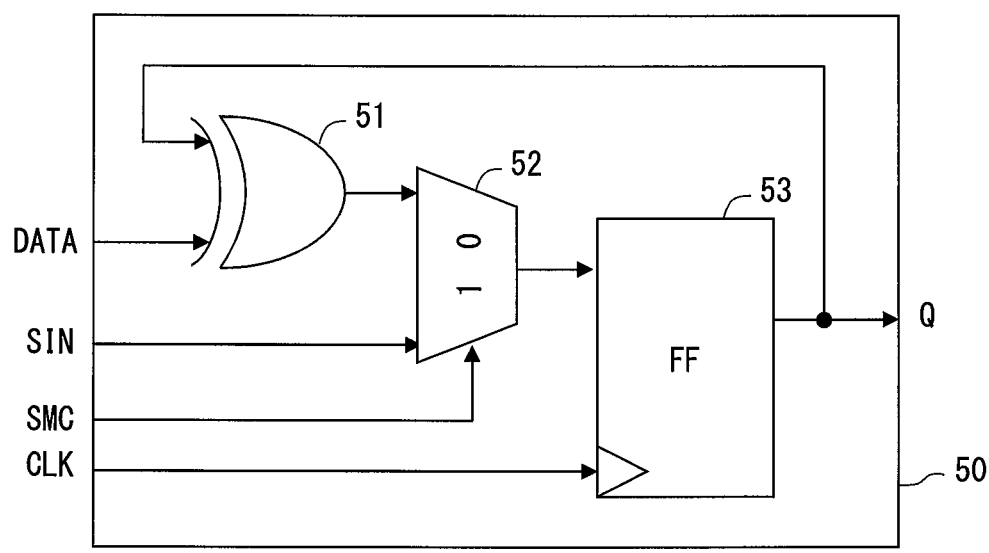
FIG. 11 is a diagram showing a configuration of a test point circuit according to a fourth embodiment.

With reference to FIG. 11, a test point circuit according to a fourth embodiment will be described. FIG. 11 is a diagram showing a configuration of an observation SFF 50 according to the fourth embodiment. As shown in FIG. 11, the observation SFF 50 includes an XOR gate 51, an MUX 52, an FF 53, a data input terminal DATA, a scan-in terminal SIN, a control input terminal SMC, a clock terminal CLK, and a data output terminal Q.

The observation SFF 50 is an observation test point circuit that is inserted in order to improve the observability and that provides an efficiency improvement effect of the clock sequential test. The observation SFF 50 is an SFF cell including a self-loop structure of the XOR gate 51. The observation SFF 50 includes a function of holding the failure that has reached the data input terminal DATA in the FF 53 of the observation SFF 50 when the plurality of capture clocks are applied in the clock sequential test.

The XOR gate 51 receives the operation result of the DUT 2 input through the data input terminal DATA and the value output from the FF 53. The exclusive OR of the XOR gate 51 is input to the MUX 52. Further, the test signal input through the scan-in terminal SIN is input to the MUX 52. The MUX 52 outputs one of the exclusive OR and the test signal to the FF 53 according to the scan enable signal input through the control input terminal SMC.

In the scan shift operation period (scan enable signal=1), the value of the data input terminal DATA is interrupted and the test signal input through the scan-in terminal SIN is captured by the FF 53. In the capture operation period (scan enable signal=0), the exclusive OR of the value of the data input terminal DATA and the value output from the FF 53 is captured by the FF 53.

The FF 53 captures the first operation result input through the data input terminal DATA in the first capture clock in one capture operation period. Then, in the second capture clock that comes after the first capture clock, the FF 53 captures the exclusive OR of the value input through the data input terminal DATA and the first operation result.

As described above, the failure captured by the FF 53 of the observation SFF 50 in one capture cycle may be captured by the FF 53 again via the XOR gate 51 of the self loop in the next capture cycle and may remain without disappearing. It is therefore possible to increase the number of failures that can be detected during one capture operation period of the clock sequential test. While the scan chain composed of only the observation test point circuits needs to be constructed in the first to third embodiments, in the observation SFF 50, it is possible to improve the efficiency of the clock sequential test without depending on the configuration of the scan chain.

Figure 12:
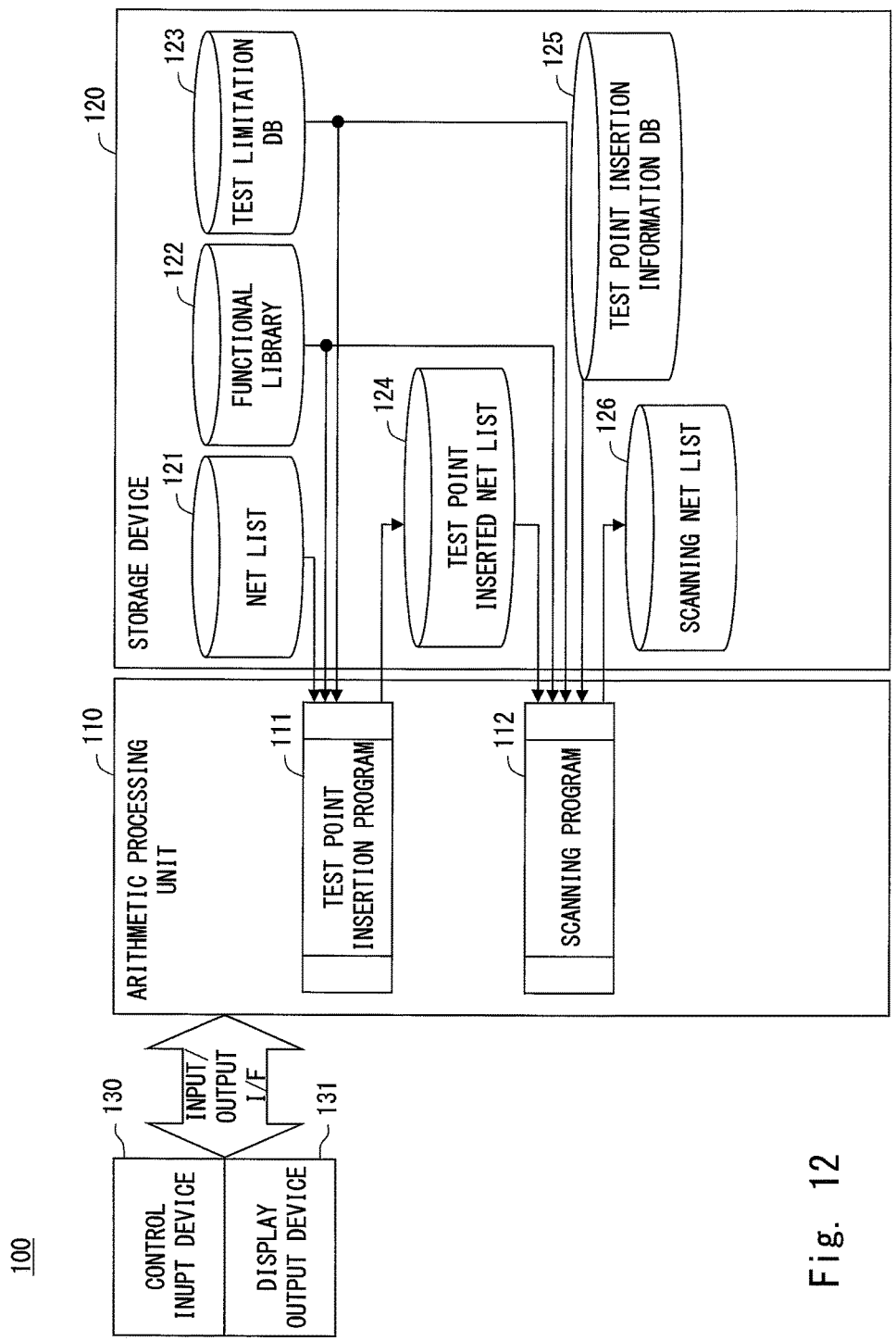
FIG. 12 is a diagram showing a configuration of a design device that designs a semiconductor device according to the embodiment.
Figure 13:
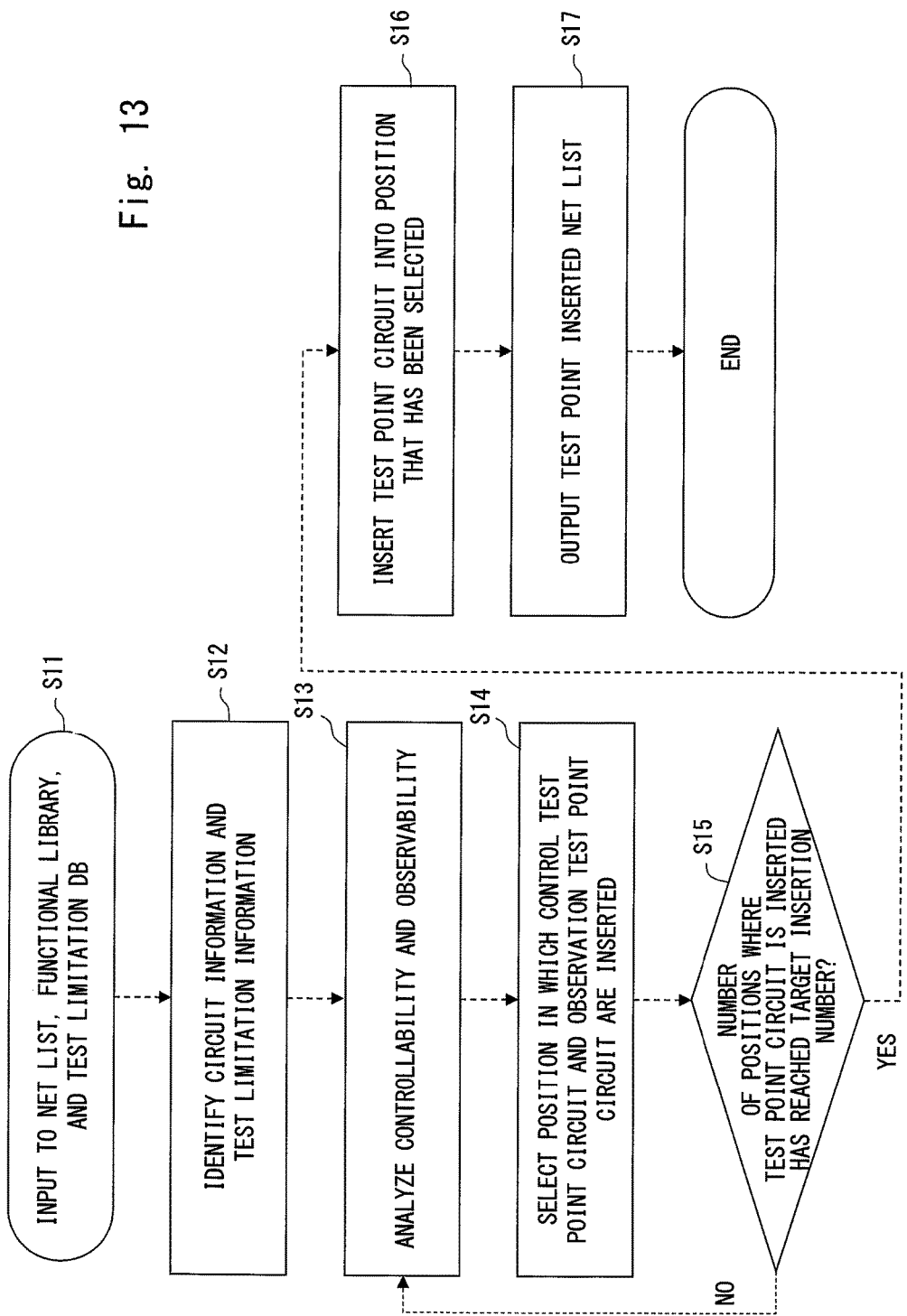
FIG. 13 is a diagram showing a design flow of the semiconductor device according to the embodiment.
Figure 14:
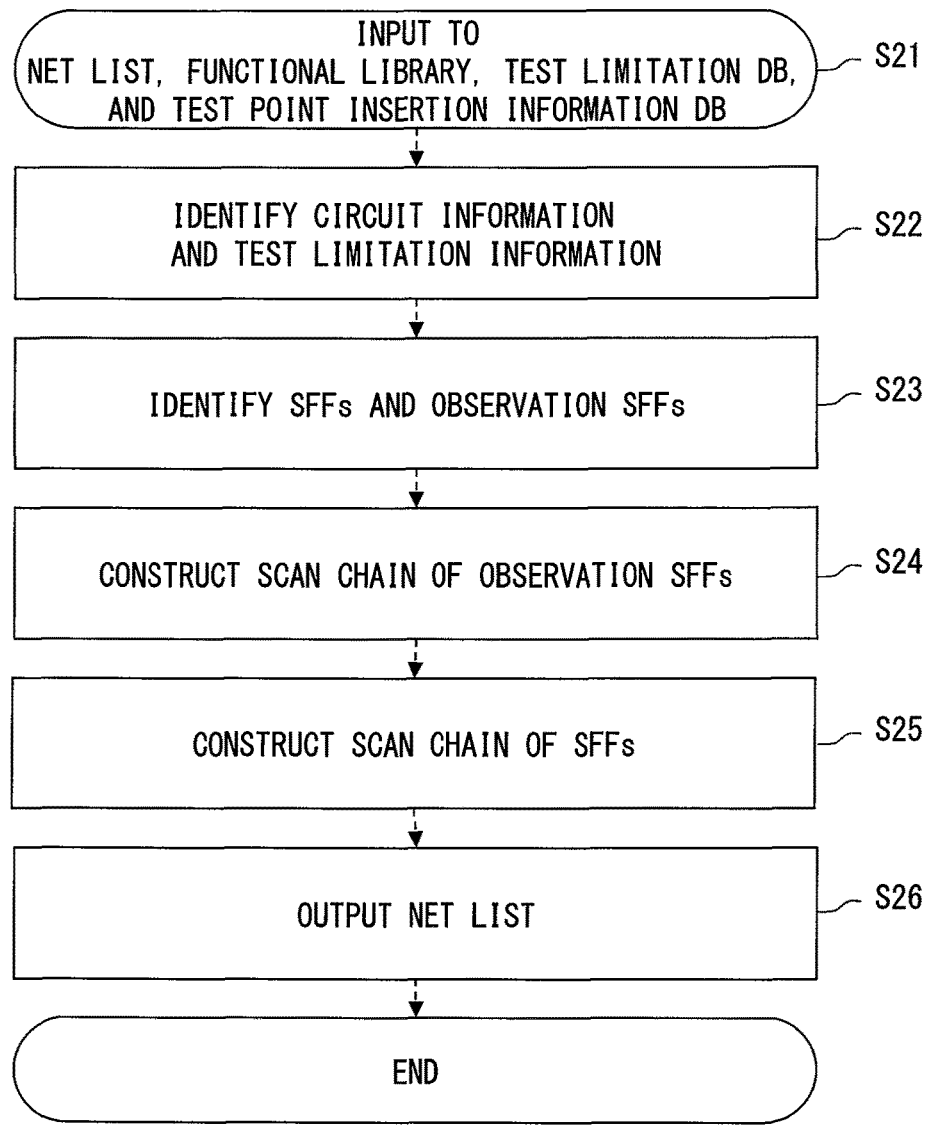
FIG. 14 is a diagram showing a design flow of the semiconductor device according to the embodiment.

With reference to FIGS. 12 to 14, a design device 100 according to the embodiment will be described. FIG. 12 is a diagram showing a configuration of a design device that designs the semiconductor device according to the embodiment. FIGS. 13 and 14 are diagrams showing a design flow of the semiconductor device according to the embodiment. A design device 100 designs the aforementioned semiconductor device in which the efficiency of the clock sequential test is high.

The design device 100 includes an arithmetic processing unit 110, a storage device 120, a control input device 130, and a display output device 131. The arithmetic processing unit 110 is a device capable of loading a program necessary for deigning the semiconductor device and executing each functional process required for the design and includes a CPU, a memory and the like. The arithmetic processing unit 110 includes a test point insertion program 111 and a scanning program 112.

The storage device 120 includes a net list 121, a functional library 122, a test limitation DB 123, a test point inserted net list 124, a test point insertion information DB 125, and a scanned net list 126. The storage device 120 indicates a storage medium such as an HDD disc or a memory that stores information in the library and the net list. The design device 100 generates the semiconductor device into which the observation test point circuits described in the first to third embodiments are inserted by referring to the net list or the library of the storage device 120 using the program of the arithmetic processing unit 110.

The control input device 130 is a general term of a device that allows a user to operate the arithmetic processing unit 110 and the storage device 120 and includes a keyboard, a mouse and the like. The display output device 131 is a device that allows the user to check the operations of the arithmetic processing unit 110 and the storage device 120 and includes a display and the like.

The net list 121 stores, besides cell information of the observation test point circuits stated above, cell information of the AND gate, the OR gate, the XOR gate and the like, and connection information among the terminals and the like. The functional library stores functions of the cell and the like. The test limitation DB 123 stores information necessary for the circuit operation when the test is performed. The information stored in the test limitation DB 123 includes, for example, information such as fixing the external output terminal to zero.

The arithmetic processing unit 110 executes the test point insertion program 111 by referring to the net list 121, the functional library 122, and the test limitation DB 123, to thereby generate the test point inserted net list 124 into which the observation test point circuits are inserted. The test point insertion program 111 includes, besides the general function of inserting the test point, a function of inserting the observation SFF 20, the observation SFF 30, or the observation SFF 40 as the observation test point circuits.

Further, the arithmetic processing unit 110 executes the scanning program 112 by referring to the functional library 122, the test limitation DB 123, the test point inserted net list 124, and the test point insertion information DB 125 to thereby generate the semiconductor device in which the efficiency of the clock sequential test is high. The test point insertion information DB 125 stores test point insertion information including connection information or the like of the test point circuit that has been inserted.

The scanning program 112 includes, besides a function of constructing the general scan chain, a function of constructing at least one scan chain of only the observation SFFs that have been inserted. The scanning program 112 constitutes, using the net list after the test point circuit is inserted, at least one scan chain of only the observation SFFs based on the test point insertion information. The test point insertion information can be output from the test point insertion program 111 or can be generated from the cell name of an instance of the test point inserted net list.

Further, the scanning program 112 is also able to execute processing for connecting the SFF or the obsSFF at the first stage of each scan chain to the PRPG 3 and processing for connecting the SFF or the obsSFF at the last stage of each scan chain to the MISR 4. The arithmetic processing unit 110 is able to generate the scanned net list 126 of the semiconductor device in which the efficiency of the clock sequential test is improved and the LBIST can be executed by executing the scanning program 112.

With reference now to FIGS. 13 and 14, a design flow of the semiconductor device will be described. With reference first to FIG. 13, processing for generating the test point inserted net list will be described. FIG. 13 is a diagram showing one example of algorithms for generating the test point inserted net list.

As shown in FIG. 13, first, predetermined information is input to the net list 121, the functional library 122, and the test limitation DB 123 (Step S11). After that, by analyzing the information that has been input, circuit information and test limitation information are identified (Step S12). In this step, information on the SFFs in the circuit, the user FFs including the shift register structure, test limitation information and the like are acquired. In the test limitation information, the target number of test point circuits to be inserted (target insertion number) is defined.

The controllability and the observability of the logic circuit in a random number base in a general TPI algorithm are analyzed based on the information on the SFFs that has been identified (Step S13). The position in which the control test point circuit and the observation test point circuit are inserted is selected based on the result of the analysis in Step S13 (Step S14).

After that, the position in which the test point circuit is inserted is selected until the time the number of positions reaches the target insertion number defined as the test limitation information (Step S15). When the number of positions does not reach a threshold of the insertion number (NO in Step S15), processing from S13 to S15 is repeated. When the number of positions has reached the target insertion number (YES in Step S15), the observation SFFs are inserted into the position that has been selected. Note that the observation SFF 20, the observation SFF 30, or the observation SFF 40 is inserted into the observation point (Step S16). After that, the test point inserted net list is output (Step S17). The processing for generating the test point inserted net list is thus completed.

With reference next to FIG. 14, processing for generating the scanned net list will be described. FIG. 14 is a diagram showing one example of algorithms for generating the scanned net list. As shown in FIG. 14, first, predetermined information is input to the net list 121, the functional library 122, the test limitation DB 123, and the test point insertion information DB 125 (Step S21). After that, by analyzing the input information, the circuit information and the test limitation information are identified (Step S22). The SFFs in the circuit and the observation SFFs corresponding to the clock sequential test are identified from the circuit information that has been identified (Step S23).

After that, at least one scan chain is constructed by the observation SFFs that have been identified (Step S24). The arithmetic processing unit 110 executes, in the scan chain composed of the observation SFFs, processing for connecting only the observation SFFs 20 or the observation SFFs 30 in serial, as described in the first embodiment. Alternatively, in the arithmetic processing unit 110, the observation SFF 40 is connected at the first stage and the observation SFFs 20 or the observation SFFs 30 are connected after the observation SFF 40, as described in the second embodiment. In the latter case, the output of the observation SFF at the last stage is connected to the data input terminal DATA2 of the observation SFF 40 at the first stage. By constructing the scan chain by the observation SFFs as stated above, the number of failures that can be detected during one capture operation period of the clock sequential test can be increased.

Besides the scan chain composed of the observation SFFs, the scan chain is constructed by the SFFs (Step S25). The scanned net list is therefore output (Step S26) and the processing for generating the scanned net list is completed. By using the scanned net list generated as stated above, the number of failures that can be detected during one capture operation period of the clock sequential test can be increased and it is possible to design the circuit capable of reducing the number of TPs to be inserted necessary to accomplish the target fault coverage or reducing the test execution time.

After the scan chain is constructed in FIG. 14, the arithmetic processing unit 110 executes a general compression circuit addition program to thereby add the LBIST circuit such as the PRPG 3, the MISR 4, the LBIST controller 5 and the like that execute the LBIST. When the semiconductor device according to the third embodiment is designed, the MISR 4 capable of capturing the output from the observation SFF in one capture operation period of the clock sequential test is inserted into the output side of the observation SFF at the last stage of the scan chain. The MISR 4 is therefore able to capture the operation result that the observation SFF inserted in the last stage of the scan chain has captured in the first capture clock in one capture operation in the next second capture clock. When the compression scan test is performed, the arithmetic processing unit 110 adds a decompressor, a compressor and the like to execute the compression scan.

The arithmetic processing unit 110 then executes a general test pattern generation program for the circuit generated by the compression circuit addition program to thereby generate the test pattern to execute the clock sequential test. It is therefore possible to accomplish the target detection rate in a short test time as shown in FIG. 7.

It is also possible to design the logic circuit in which the efficiency of the clock sequential test is high using the observation SFF 50 using the design device 100 shown in FIG. 12. The design device 100 executes the test point insertion program 111 and inserts the observation SFF 50 into the observation point. The design device 100 does not construct the scan chain by the observation SFF 50 and constructs the scan chain by the SFF 10. That is, the design device 100 does not perform processing of Step S24 in FIG. 14 and performs processing of Step S25. As described above, by using the observation SFF 50, there is no need to provide a function of the program for constructing the scan chain composed of only the observation SFF 50.

The above program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

As described above, according to the embodiment, a structure in which the XOR output of the scan input and the data input is input to the flip-flop in one capture operation period of the clock sequential test is included, whereby it is possible to capture the propagation of the failure that has reached the data input and the scan input. It is therefore possible to hold and compress the failure that has reached the flip-flop in each capture cycle without causing the failure to disappear when the capture clock is applied a plurality of times in the clock sequential test. It is therefore possible to reduce the test time to reach the target fault coverage.

Note that the test point circuit according to the embodiment may be expressed as the following Supplementary Notes. The test point circuit described below corresponds to FIG. 11.

(Supplementary Note 1)

A test point circuit that is inserted into a combination circuit, the combination circuit outputting an operation result in accordance with a test signal that is scanned in, the test point circuit comprising:

a flip-flop that captures a first operation result from the combination circuit in a first capture clock in one capture operation period of a clock sequential test; and an XOR gate that outputs an exclusive OR of the first operation result and a second operation result from the combination circuit to the flip-flop;

wherein the flip-flop captures the exclusive OR in a second capture clock that comes after the first capture clock.

(Supplementary Note 2)

A design device of a semiconductor device including an arithmetic processing unit capable of executing predetermined processing in accordance with a program that has been set in advance, wherein:

the semiconductor device comprises:

a scan flop-flop that constitutes a scan chain; and the test point circuit according to Supplementary Note 1, and the arithmetic processing unit executes processing for analyzing the probability that the operation result from the combination circuit becomes a predetermined logic state, the arithmetic processing unit selects a position in which the test point circuit is to be inserted based on the result of the analysis processing, the arithmetic processing unit inserts the test point circuit into the selected position, and the arithmetic processing unit does not execute construction of the scan chain by the test point circuit when the scan chain is constructed by the scan flip-flop.

In the above embodiment, the example of inserting the test point circuit (TPI) and performing the clock sequential test (multi-cycle test) in order to improve the fault coverage in the semiconductor device capable of executing the LBIST has been described.

In the following embodiment, an example of performing the clock sequential test in order to reduce the test execution time without inserting the test point circuit in the semiconductor device capable of executing the LBIST will be described.

As described above, the clock sequential test is a multi-cycle test that captures the operation result from the combination circuit in a plurality of capture clocks in one capture operation period. The clock sequential test is effective for reducing the LBIST execution time even when the test point circuit is not inserted.

In the following embodiment as well, the schematic configuration of the semiconductor device capable of executing the LBIST is the same as the configuration of the semiconductor device shown in FIG. 1. Therefore, a detailed description thereof will be omitted. Further, the operation waveform example of the clock sequential test by the plurality of clocks is already described with reference to FIG. 5.

The SFF 10 used in FIG. 1 is not provided for the clock sequential test. The present inventors have invented the scan flip-flop for the sequential test (hereinafter this will be referred to as an seqSFF) for the clock sequential test used in place of the SFF 10 shown in FIG. 1 in order to further improve the effect of the clock sequential test.

The scan flip-flop for the sequential test according to this embodiment constitutes the scan chain capable of executing the scan test of the LSI and performs the clock sequential test. The seqSFF according to the embodiment has a logical structure capable of reducing the test execution time and increasing the fault coverage.

Specifically, the seqSFF according to the embodiment includes a test enable input terminal to which the test enable signal is input. The seqSFF captures, in accordance with the test enable signal, in one capture operation period of the clock sequential test, in the second capture clock that comes after the first capture clock, the first operation result from the combination circuit that the first cell which is provided before the scan flip-flop for the sequential test in the scan chain or at the last stage of the scan chain has captured in the first capture clock.

The semiconductor device using the seqSFF according to the embodiment can be applied, for example, to products in which the POST is implemented. Further, this semiconductor device is also applicable to products in which it is desired to reduce the testing cost when the LBIST is applied in a mass production test process or design devices (EDA tools) in which the LBIST is implemented and the like.

Fifth Embodiment

Figure 15:
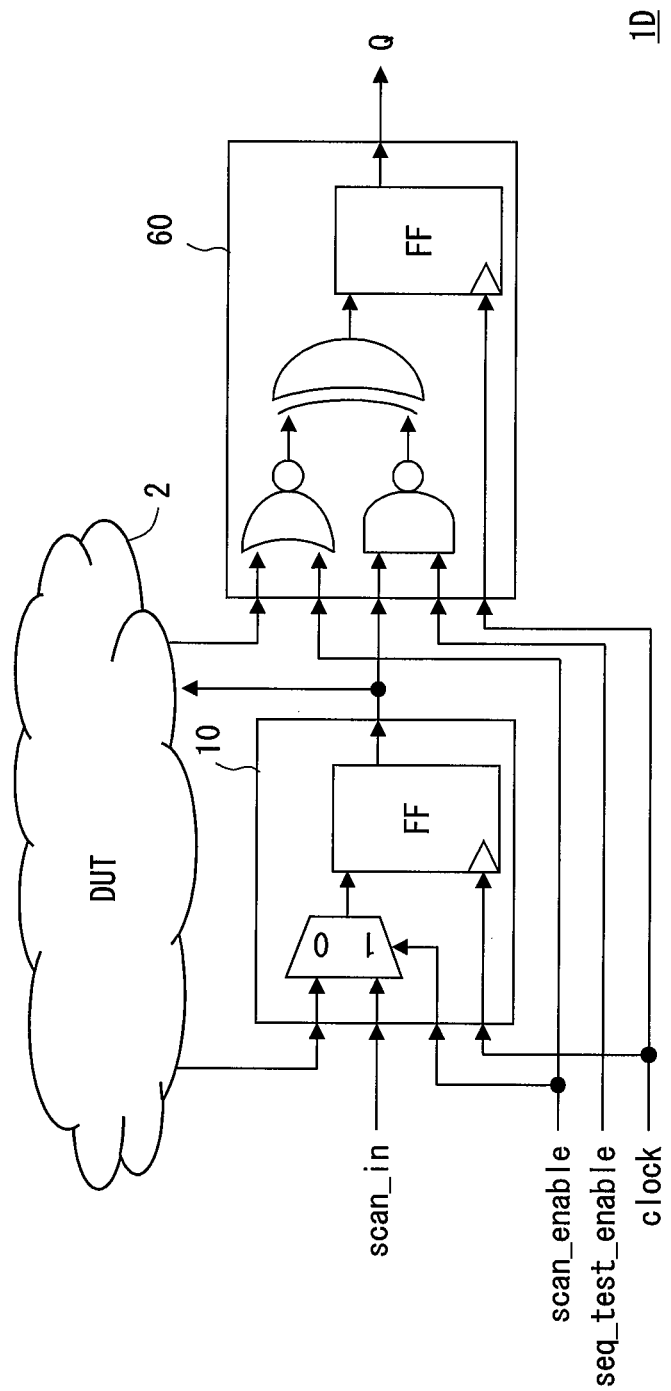
FIG. 15 is a diagram showing a configuration of a semiconductor device in which a scan flip-flop for a sequential test according to a fifth embodiment is inserted.
Figure 16:
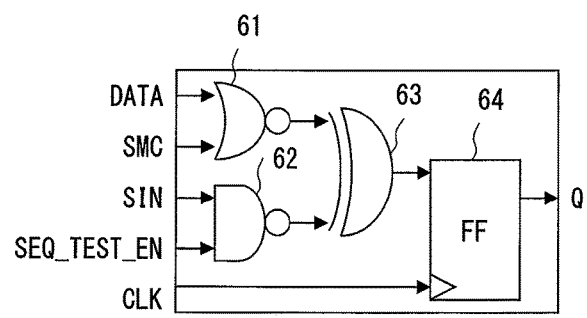
FIG. 16 is a diagram showing a configuration of the scan flip-flop for the sequential test according to the fifth embodiment.

With reference to FIGS. 15 and 16, a scan flip-flop for a sequential test (seqSFF) used in a semiconductor device that executes the clock sequential test will be described. FIG. 15 is a diagram showing a configuration of the semiconductor device in which the seqSFF according to a fifth embodiment is inserted. A semiconductor device 1D shown in FIG. 15 includes a minimum configuration capable of holding the failure that has reached the SFF 10 when the plurality of clocks are applied in the clock sequential test without causing the failure to disappear also in the next capture cycle. FIG. 15 shows only the minimum configuration of the semiconductor device 1D for describing an seqSFF 60.

As shown in FIG. 15, the semiconductor device 1D includes a DUT 2, an SFF 10, and an seqSFF 60. The seqSFF 60 is connected in serial after the SFF 10, whereby one scan chain is constructed. Since the configurations of the DUT 2 and the SFF 10 are the same as those described with reference to FIG. 1, descriptions thereof will be omitted.

FIG. 16 is a diagram showing a configuration of the seqSFF 60 according to the fifth embodiment. As shown in FIG. 16, the seqSFF 60 includes an NOR gate 61, a NAND gate 62, an XOR gate 63, an FF 64, a data input terminal DATA, a control input terminal SMC, a scan-in terminal SIN, a test enable input terminal SEQ_TEST_EN, a clock terminal CLK, and a data output terminal Q. The input/output configuration of the seqSFF 60 is the same as that of the SFF 10 except for the test enable input terminal SEQ_TEST_EN. That is, the seqSFF 60 includes the test enable input terminal SEQ_TEST_EN in addition to the input/output configuration of the SFF 10.

The output of the SFF 10 is connected to the scan-in terminal SIN of the seqSFF 60. The seqSFF 60 is able to switch the normal user operation and the scan test operation. The seqSFF 60 is further able to switch the scan shift operation and the capture operation in the scan test operation period. The seqSFF 60 captures the operation result from the DUT 2 by each of the plurality of capture clocks in one capture operation period.

For example, the first capture clock applied in one capture operation period is referred to as a first capture clock and the capture clock that comes after the first capture clock is referred to as a second capture clock. Further, the operation result from the DUT 2 captured by the first capture clock is referred to as a first operation result. The period in which one capture clock pulse operation is performed in one capture operation period is referred to as a capture cycle.

Note that the first capture clock may not be a capture clock that is applied first in one capture operation period and may be a capture clock that is applied after that. The second capture clock may be a capture clock that is applied after the first capture clock in one capture operation period.

The operation result from the DUT 2 is input to the data input terminal DATA in the capture operation period. The test signal is input to the scan-in terminal SIN in the scan shift operation period and the first operation result that the previous SFF 10 of the scan chain has captured in the first capture clock is input to the scan-in terminal SIN in the capture operation period.

A test enable signal (seq_test_enable) is input to the test enable input terminal SEQ_TEST_EN. The seqSFF 60 switches the normal user operation and the scan test operation in accordance with the test enable signal. For example, when the test enable signal is low (0), the user operation is selected and when the test enable signal is high (1), the scan test operation is selected.

A scan enable signal (scan_enable) is input to the control input terminal SMC. The seqSFF 60 switches the scan shift operation and the capture operation in accordance with the scan enable signal. When the test enable signal is high (1) and the scan enable signal is high (1), the scan shift operation is selected and when the scan enable signal is low (0), the capture operation is selected.

The NOR gate 61 receives the scan enable signal input through the control input terminal SMC (scan-enable) and the signal input through the data input terminal DATA and outputs the negative OR thereof. The NAND gate 62 receives the first operation result input to the scan-in terminal SIN and the test enable signal and outputs the negative AND thereof. The XOR gate 63 receives the negative OR from the NOR gate 61 and the negative AND from the NAND gate 62 and outputs the exclusive OR thereof.

The FF 64 captures, in accordance with the clock signal (clock) input from the clock terminal CLK, the value output from the XOR gate 63 and outputs the captured value from the data output terminal Q. In the scan shift operation period, the FF 64 captures the test signal. Further, in the capture operation period, the FF 64 captures the exclusive OR that the XOR gate 63 outputs in the second capture clock that comes after the first capture clock. That is, the first operation result that the previous SFF 10 of the scan chain has captured in the first capture clock is propagated to the subsequent seqSFF 60 in the second capture clock that comes after the first capture clock.

Figure 17:
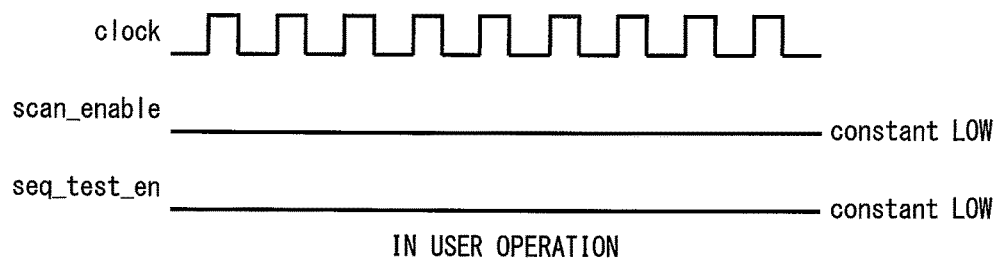
FIG. 17 is a diagram showing an operation waveform example of the semiconductor device shown in FIG. 15.
Figures 18, 19:
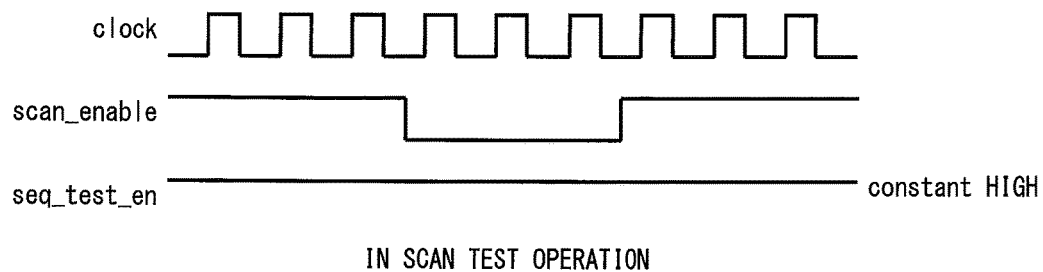
FIG. 18 is a diagram showing an operation waveform example of the semiconductor device shown in FIG. 15.
FIG. 19 is a truth table of the scan flip-flop for the sequential test shown in FIG. 16.

Now, an operation of the semiconductor device 1D will be described. FIGS. 17 and 18 are diagrams each showing an operation waveform example of the semiconductor device ID according to FIG. 15. As shown in FIG. 17, in the user operation, the scan enable signal is set to 0 (constant LOW) and the test enable signal is set to 0 (constant LOW). At this time, both the SFF 10 and the seqSFF 60 capture the value input through the data input terminal DATA.

As shown in FIG. 18, in the scan test operation, the test enable signal is set to 1 (constant HIGH). In the scan test operation, in the scan shift operation period, the scan enable signal is set to 1 (HIGH). At this time, the SFF 10 and the seqSFF 60 capture the value from the scan-in terminal SIN and the scan shift operation is performed.

In the scan test operation, the scan enable signal is set to 0 (LOW) in the capture operation period. At this time, the SFF 10 captures the value from the data input terminal DATA and the seqSFF 60 captures the exclusive OR of the values from the scan-in terminal SIN and the data input terminal DATA. FIG. 19 shows a truth table of the scan flip-flop for the sequential test shown in FIG. 16. The seqSFF 60 includes a configuration that satisfies the functions shown in the truth table shown in FIG. 19.

Consider a case in which the capture clock is applied twice in the clock sequential test. It is assumed that the SFF 10 captures the influence of the propagation of a failure in the first capture cycle. That is, the output values of the data output terminal Q of the SFF 10 after the first capture clock is applied are inverted to each other between the case in which the normal operation is performed and the case in which a failure occurs.

Since the seqSFF 60 captures the exclusive OR of the value from the data input terminal DATA and the value from the scan-in terminal SIN in the second capture cycle, when the value of the data output terminal Q of the SFF 10 has been inverted, the value that the seqSFF 60 captures is also inverted. As stated above, the failure captured by the SFF 10 in the first capture cycle is held by the seqSFF 60 in the second capture cycle.

Consider a case in which the scan chain is composed of the SFF 10 in place of the seqSFF 60 in FIG. 15. In the clock sequential test, the operation result that has reached the data input terminal DATA in the previous SFF 10 in the first capture clock is propagated to nowhere in the next second capture clock and disappears unless it reaches the subsequent SFF 10 via the DUT 2. The probability that the operation result disappears increases as the number of logic gates increases. Since there are a large number of logic gates in a general logic, the probability that the failure can be held after application of the plurality of capture clocks is low.

On the other hand, in the semiconductor device 1D according to the fifth embodiment, the operation result that has reached the SFF 10 in the first capture clock in one capture operation period is propagated to the subsequent seqSFF 60 on the scan chain in the next second capture clock. As described above, in the semiconductor device 1D, it is possible to increase the fault coverage when the capture clock is applied a plurality of times.

Further, by executing the clock sequential test in the semiconductor device 1D, a large number of failures can be detected in one capture operation period, whereby it is possible to reduce the test time.

The structure of the seqSFF 60 is not limited to the logical structure shown in FIG. 16. The seqSFF 60 may have any structure as long as the functions shown in the truth table shown in FIG. 21 are satisfied by the schematic configuration of the scan flip-flop for the sequential test shown in FIG. 20.

That is, when the scan enable signal is 0 and the test enable signal is 0, the value of the data input terminal DATA is captured. When the scan enable signal is 0 and the test enable signal is 1, the exclusive OR of the data input terminal DATA and the value of the scan-in terminal SIN
DATA⊕SIN
or the negative exclusive OR of the data input terminal DATA and the value of the scan-in terminal SIN
¬(DATA⊕SIN)
is captured.

When the scan enable signal is 1, regardless of the value of the test enable signal, the negative value of the value of the scan-in terminal SIN (SIN) or the value of the scan-in terminal SIN
¬SIN
is captured.

Figures 23, 24:
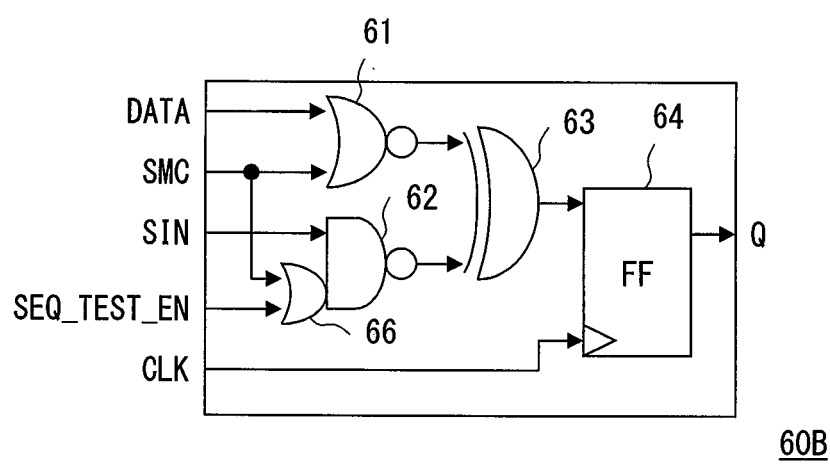
FIG. 23 is a truth table of the scan flip-flop for the sequential test shown in FIG. 22.
FIG. 24 is a diagram showing another configuration of the scan flip-flop for the sequential test according to the fifth embodiment.
Figures 25, 26:
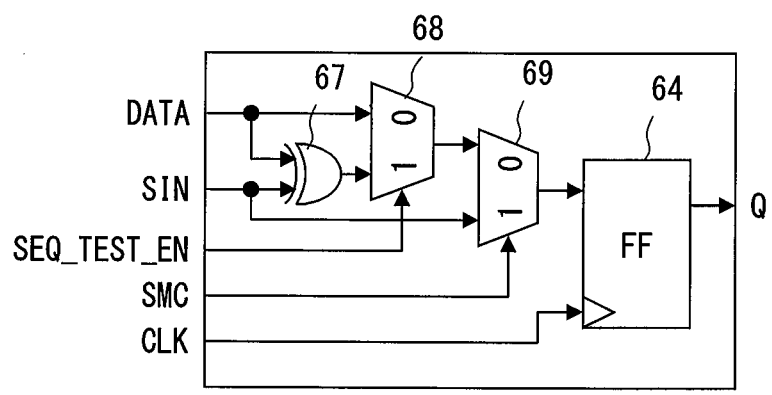
FIG. 25 is a truth table of the scan flip-flop for the sequential test shown in FIG. 24.
FIG. 26 is a diagram showing another configuration of the scan flip-flop for the sequential test according to the fifth embodiment.

FIGS. 22, 24, and 26 show other logic circuit examples of the seqSFF 60 that satisfy the truth table shown in FIG. 21. FIGS. 23, 25, and 27 respectively show the truth table of an seqSFF 60A shown in FIG. 22, the truth table of an seqSFF 60B shown in FIG. 24, and the truth table of an seqSFF 60C shown in FIG. 23.

The seqSFF 60A shown in FIG. 22 includes an NOR gate 61, an XOR gate 63, an FF 64, and an OR gate 65. The NOR gate 61 receives the scan enable signal input through the control input terminal SMC (scan-enable) and the signal input through the data input terminal DATA and outputs the negative OR thereof.

The OR gate 65 has one input terminal that is a negative logic. The OR gate 65 receives the value from the scan-in terminal SIN and the negative logic of the test enable signal and outputs the OR thereof. The XOR gate 63 receives the negative OR from the NOR gate 61 and the OR from the OR gate 65 and outputs the exclusive OR thereof. The FF 64 captures the value output from the XOR gate 63 and outputs the captured value from the data output terminal Q.

The operation waveform of the seqSFF 60A shown in FIG. 22 is the same as the operation waveform shown in FIGS. 17 and 18. That is, as shown in FIG. 17, in the user operation, the scan enable signal is set to 0 (constant LOW) and the test enable signal is set to 0 (constant LOW). Further, as shown in FIG. 18, in the scan test operation, the test enable signal is set to 1 (constant HIGH). In the scan test operation, in the scan shift operation period, the scan enable signal is set to 1 (HIGH).

As described above, even when the configuration shown in FIG. 22 is employed, in the capture operation period, the first operation result that the previous SFF 10 of the scan chain has captured in the first capture clock is propagated to the subsequent seqSFF 60 in the second capture clock that comes after the first capture clock.

The seqSFF 60B shown in FIG. 24 includes an NOR gate 61, an NAND gate 62, an XOR gate 63, an FF 64, and an OR gate 66. The NOR gate 61 receives the scan enable signal input through the control input terminal SMC (scan-enable) and the signal input through the data input terminal DATA and outputs the negative OR thereof.

The OR gate 66 outputs the OR of the scan enable signal and the test enable signal. The NAND gate 62 receives the value from the scan-in terminal SIN and the OR from the OR gate 66 and outputs the negative AND thereof. The XOR gate 63 receives the negative OR from the NOR gate 61 and the negative AND from the NAND gate 62 and outputs the exclusive OR thereof. The FF 64 captures the value output from the XOR gate 63 and outputs the captured value from the data output terminal Q.

The seqSFF 60C shown in FIG. 26 includes an XOR gate 67, an MUX 68, an MUX 69, and an FF 64. The XOR gate 67 receives the value from the data input terminal DATA and the value from the scan-in terminal SIN and outputs the exclusive OR thereof. The MUX 68 receives the value from the data input terminal DATA and the exclusive OR from the XOR gate 67. In the MUX 68, the value from the data input terminal DATA becomes valid when the test enable signal is low (0) and the value from the XOR gate 67 becomes valid when the test enable signal is high (1).

The value from the MUX 68 is input to the MUX 69. Further, the MUX 69 receives the value from the scan-in terminal SIN. In the MUX 69, the value from the MUX 68 becomes valid when the scan enable signal is low (0) and the value from the scan-in terminal SIN becomes valid when the scan enable signal is high (1). The FF 64 captures the value output from the MUX 69 and outputs the captured value from the data output terminal Q.

FIGS. 28 and 29 show operation waveforms of the semiconductor device in which the seqSFFs 60B shown in FIG. 24 and the seqSFFs 60C shown in FIG. 26 are inserted. As shown in FIG. 28, in the user operation, the scan enable signal is set to 0 (constant LOW). At this time, the test enable signal may have any value of 0 and 1 (don't care).

As shown in FIG. 29, in the scan test operation, in the capture operation period, the scan enable signal is set to 0 (LOW) and the test enable signal is set to 1 (HIGH). In the scan test operation, in the scan shift operation period, the scan enable signal is set to 1 (HIGH). At this time, the test enable signal may have any value of 0 and 1 (don't care).

As described above, a structure in which the exclusive OR or the negative exclusive OR of the value of the scan-in terminal SIN and the value of the data input terminal DATA is captured is included, whereby it is possible to concurrently capture the failures that have reached the scan-in terminal SIN and the data input terminal DATA. It is therefore possible to hold the failure that has reached the seqSFF 60 in each capture cycle when the capture clock is applied a plurality of times in the clock sequential test. As a result, the number of failures that can be detected in one capture period increases, whereby it is possible to reduce the test time to accomplish the target detection rate.

Sixth Embodiment

Figure 30:
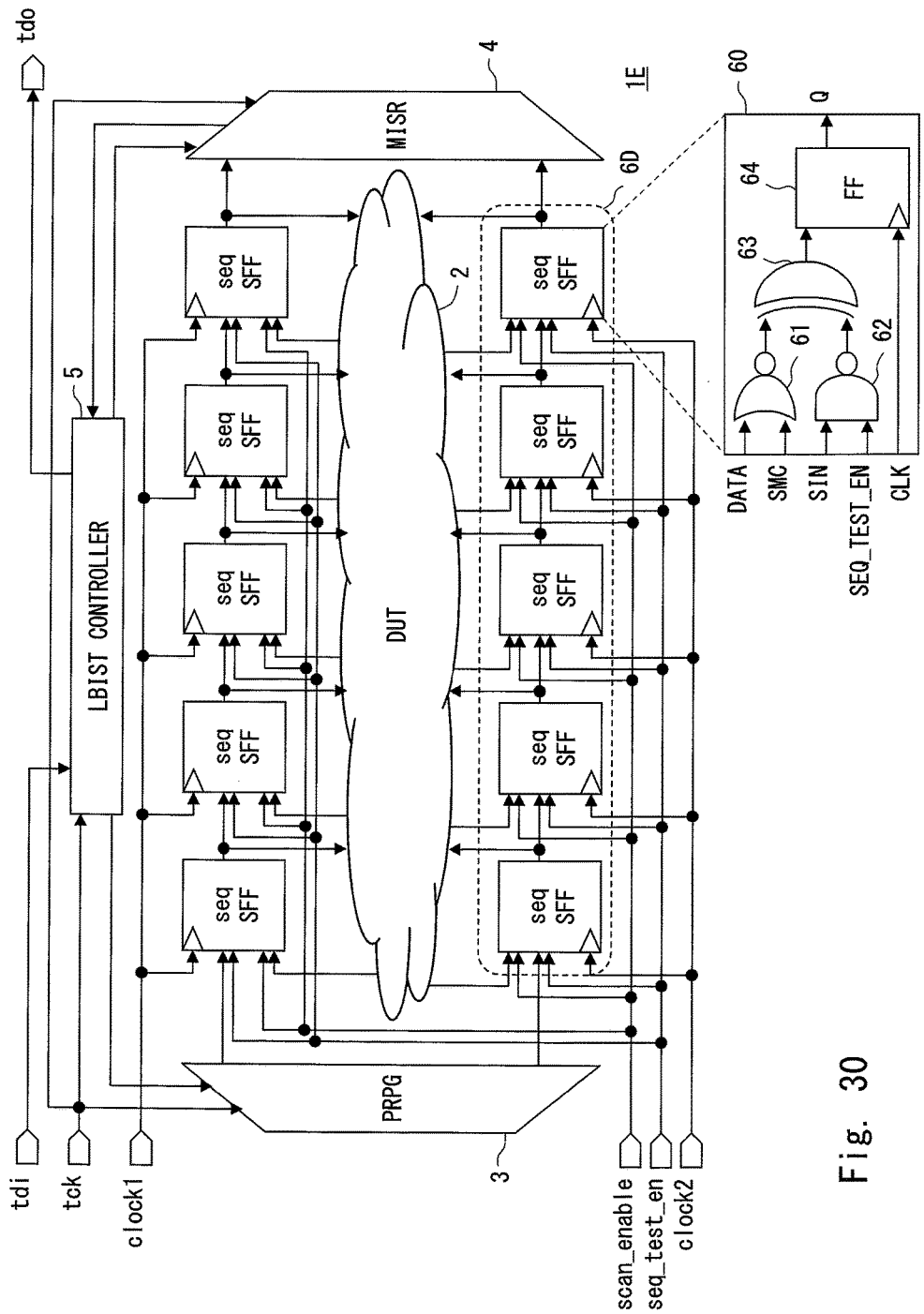
FIG. 30 is a diagram showing a configuration of a semiconductor device in which a scan flip-flop for a sequential test according to a sixth embodiment is inserted.

With reference to FIG. 30, a semiconductor device in which a scan flip-flop for a sequential test (seqSFF) is inserted according to a sixth embodiment will be described. FIG. 30 is a diagram showing a configuration of a semiconductor device 1E in which the seqSFF according to the sixth embodiment is inserted.

As shown in FIG. 30, the semiconductor device 1E includes a DUT 2, a PRPG 3, an MISR 4, an LBIST controller 5, and a plurality of seqSFFs 60. Since the configurations of the components other than the seqSFFs 60 are the same as those described with reference to FIG. 1, detailed descriptions thereof will be omitted.

The semiconductor device 1E includes one or more scan chains. In the example shown in FIG. 30, each of the scan chains is composed of only the seqSFFs 60. In FIG. 30, one scan chain composed of the seqSFFs 60 is indicated by a scan chain 6D. In the scan chain 6D, five seqSFFs 60 are connected in serial.

The configuration of the seqSFF 60 is the same as that shown in FIG. 16. In place of the seqSFF 60, the seqSFF having another configuration that satisfies the functions of the truth table shown in FIG. 21 may be used.

A scan enable signal is input to the control input terminal SMC of each of the seqSFFs 60. Further, a test enable signal is input to the test enable input terminal SEQ_TEST_EN of each of the seqSFFs 60. The test enable input terminal SEQ_TEST_EN is not necessarily controlled by the external input terminal and may be controlled by a test mode register or the like.

In the user operation, the test enable signal is set to 0 and the scan enable signal is set to 0. The scan enable signal=0 and the test enable signal=0 are respectively supplied to the control input terminal SMC and the test enable input terminal SEQ_TEST_EN of each seqSFF 60. Accordingly, the value input through the scan-in terminal SIN is interrupted and the seqSFF 60 captures the value from the data input terminal DATA.

In the scan test operation, the test enable signal is set to 1. In the scan shift operation period, the scan enable signal is set to 1. Each of the seqSFFs 60 captures the value from the scan-in terminal SIN, whereby the scan shift operation is performed. In the capture operation, the scan enable signal is set to 0. Each seqSFF 60 captures the exclusive OR of the value from the data input terminal DATA and the value from the scan-in terminal SIN.

Therefore, when the capture clock is applied a plurality of times by the clock sequential test, the failure that has reached the seqSFF 60 in one capture cycle is captured by the subsequent seqSFF 60 on the scan chain via the scan-in terminal SIN in the next capture cycle.

When the number of stages of the scan chain 6D is N, for example, the failure captured by the top seqSFF 60 may be held by the seqSFF 60 on the scan chain 6D until the time when the capture clock is applied N times at maximum. As a result, it is possible to increase the number of failures that can be detected during the capture operation period in the clock sequential test.

Figure 31:
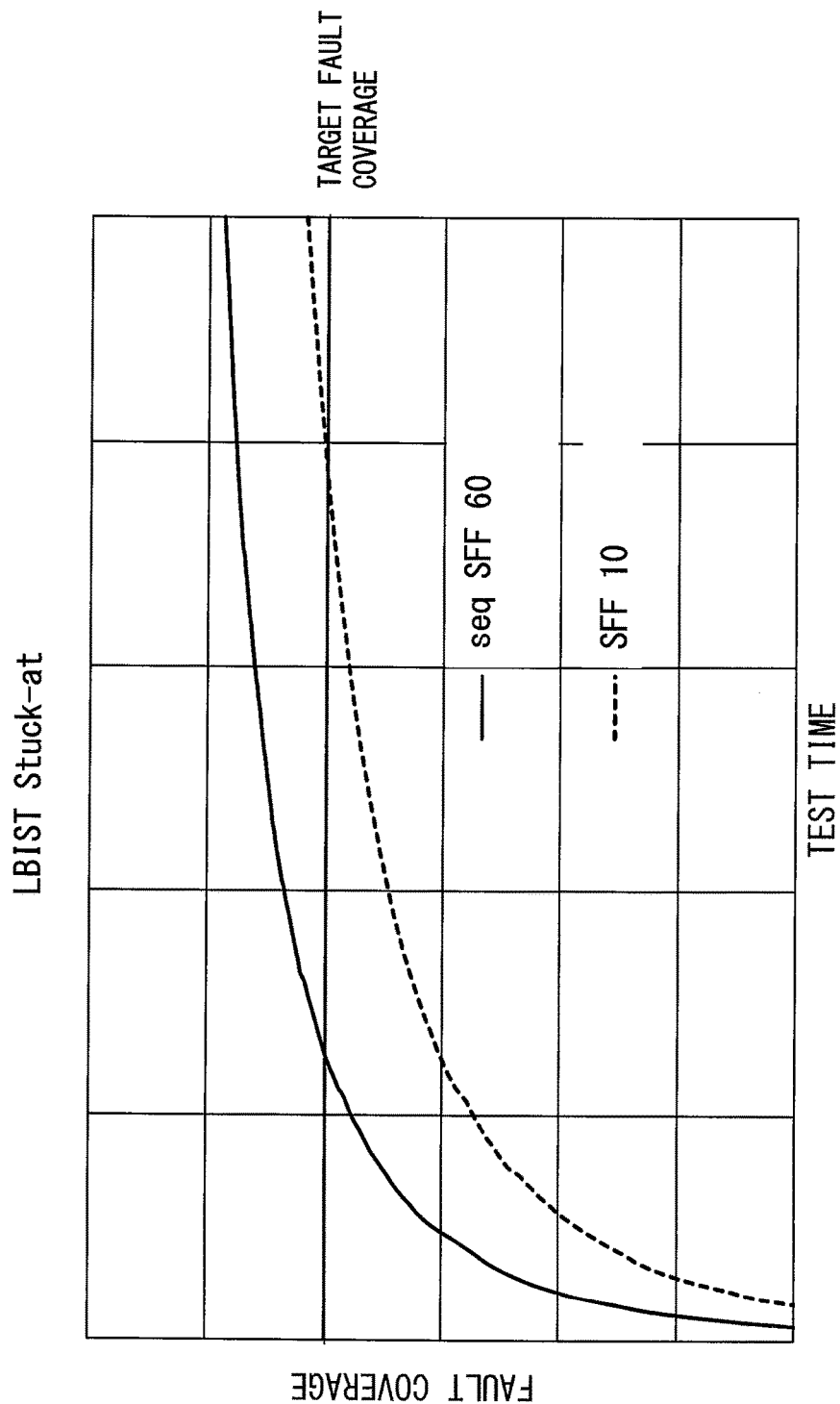
FIG. 31 is a diagram showing a fault coverage with respect to a scan test time of the semiconductor device according to the sixth embodiment.

With reference to FIG. 31, an effect of reducing the test time will be described. FIG. 31 is a diagram showing the fault coverage with respect to the test time of the semiconductor device 1E according to the sixth embodiment. In FIG. 31, the horizontal axis indicates the test time and the vertical axis indicates the fault coverage. Further, in FIG. 31, the solid line shows the result of the semiconductor device 1E that uses the seqSFFs 60 according to the embodiment and the dashed line shows the result of the semiconductor device when the scan chain is composed of the SFFs 10 in place of the seqSFFs 60 shown in FIG. 30.

As shown in FIG. 31, in the semiconductor device 1E according to the sixth embodiment, the seqSFFs 60 are used, whereby it is possible to accomplish the target fault coverage in the test time shorter than that when the SFFs 10 are used.

Seventh Embodiment

Figure 32:
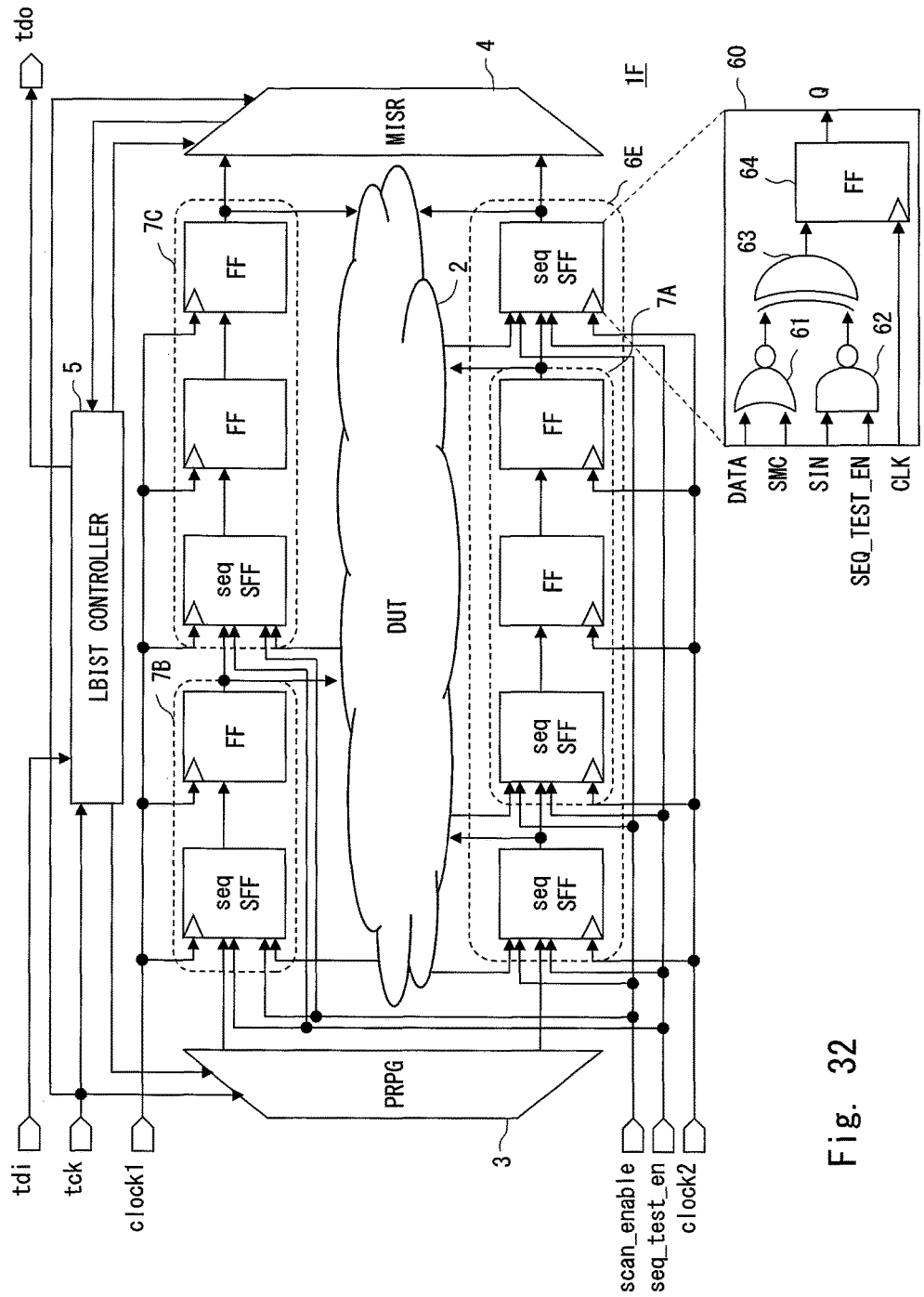
FIG. 32 is a diagram showing a configuration of a semiconductor device in which a scan flip-flop for a sequential test according to a seventh embodiment is inserted.

With reference to FIG. 32, a semiconductor device in which a scan flip-flop for a sequential test (seqSFF) according to a seventh embodiment is inserted will be described. FIG. 32 is a diagram showing a configuration of a semiconductor device 1F in which the seqSFF according to the seventh embodiment is inserted.

In the semiconductor device 1F shown in FIG. 32, some SFFs are substituted with the seqSFFs 60 in a general LBIST configuration. An seqSFF having another configuration that satisfies the truth table shown in FIG. 21 may be used in place of the seqSFF 60. In FIG. 32, "FF" indicates a flip-flop that does not have a scan function such as a scan-in or a scan-out. In this example, the flip-flop that does not have the scan function is referred to as a normal flip-flop (hereinafter this will be referred to as a normal FF).

The semiconductor device 1F includes one or more scan chains. In the example shown in FIG. 32, a shift register structure 7A in the user logic is incorporated into at least one scan chain 6E among the plurality of scan chains. In the shift register structure 7A, the top part is substituted with the seqSFF 60 and two normal FFs are connected in serial after the seqSFF 60. In the scan chain 6E, the seqSFFs 60 are arranged before and after the shift register structure 7A.

The data output terminal Q of the previous seqSFF 60 is connected to the scan-in terminal SIN of the seqSFF 60 of the shift register structure 7A. The operation result from the DUT 2 that the seqSFF 60 at the top of the shift register structure 7A captures is directly captured by the subsequent normal FF. Further, the data output terminal Q of the normal FF at the last stage of the shift register structure 7A is connected to the input to the DUT 2 and the scan-in terminal SIN of the subsequent seqSFF 60 on the scan chain 6E.

Further, in the example shown in FIG. 32, a shift register structure 7B including one seqSFF and one normal FF and a shift register structure 7C including one seqSFF and two normal FFs are constituted in the user logic. The shift register structure 7B and the shift register structure 7C constitute one scan chain.

In the shift register structure 7B, the normal FF is connected in serial after the seqSFF 60. In the shift register structure 7C, two normal FFs are connected in serial after the seqSFF 60. The data output terminal Q of the normal FF of the shift register structure 7B is connected to the input to the DUT 2 and the scan-in terminal SIN of the seqSFF 60 of the shift register structure 7C.

While not shown in FIG. 32, the FFs other than the shift register structure are substituted with the seqSFFs 60. The output of the seqSFF 60 or the shift register structure is connected to the scan-in terminal SIN of the seqSFF 60 connected thereafter. The scan chain is thus constituted. In the shift register structures 7A to 7C and the other shift register structures, the scan shift operation is performed, similar to the case in which the scan chain is composed of the SFFs.

Similar to the sixth embodiment, the scan enable signal is input to the control input terminal SMC of each seqSFF 60 also in the seventh embodiment. Further, the test enable signal is input to the test enable input terminal SEQ_TEST_EN of each seqSFF 60.

In the seventh embodiment, when the capture clock is applied a plurality of times in the clock sequential test, the failure that has reached the seqSFF 60 at the top of the shift register structure in one capture cycle is propagated to the subsequent normal FF of the shift register structure without any loss in the next capture cycle. It is therefore possible to improve the efficiency of the clock sequential test.

Further, in the seventh embodiment, the normal FFs other than the top of the shift register structure are directly incorporated into the scan chain. It is therefore possible to suppress the increase in the area compared to the case in which all the FFs are substituted with the flip-flops including the scan function.

Eighth Embodiment

Figure 33:
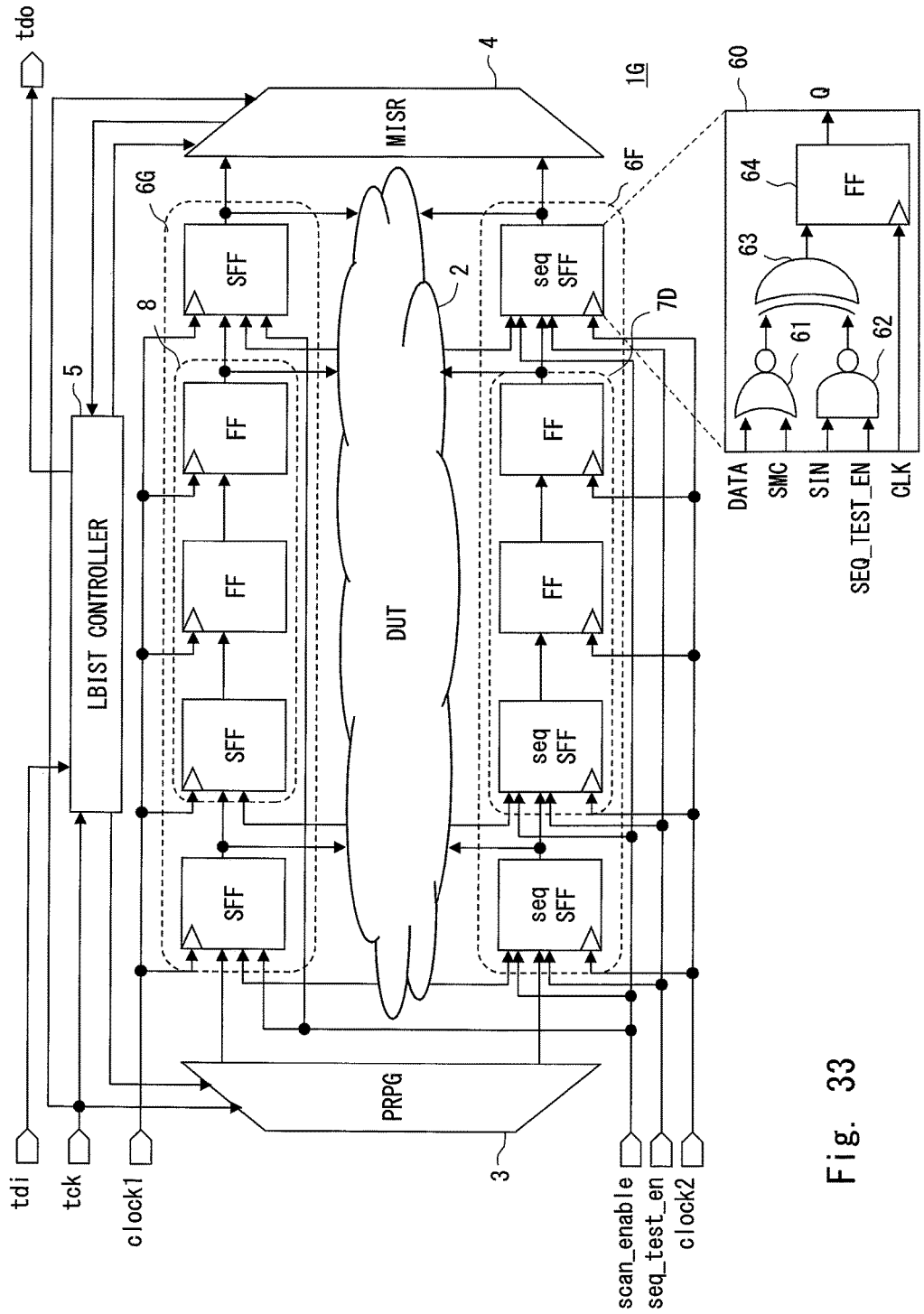
FIG. 33 is a diagram showing a configuration of a semiconductor device in which a scan flip-flop for a sequential test according to an eighth embodiment is inserted.

With reference to FIG. 33, a semiconductor device in which a scan flip-flop for a sequential test (seqSFF) according to an eighth embodiment is inserted will be described. FIG. 33 is a diagram showing a configuration of a semiconductor device 1G in which the seqSFF according to the eighth embodiment is inserted.

Some user FFs in the circuit do not contribute to the improvement in the efficiency of the clock sequential test even when they are substituted with the seqSFFs 60. Since the area of the seqSFF 60 is larger than that of the SFF, if all the user FFs are substituted with the seqSFFs 60, it causes an increase in the area of the circuit.

The semiconductor device 1G according to the eighth embodiment has a structure in which the target to be substituted with the seqSFF 60 is limited to some user FFs. In FIG. 33, the flip-flop that does not include the scan function is denoted by an FF and the flip-flop that includes the scan function is denoted by an SFF.

First, in the eighth embodiment, when the plurality of capture clocks are applied in the clock sequential test, the user FF in which the number of failures to be detected is efficiently increased when the failure that has reached the data input terminal DATA is accumulated is selected.

The selection of the user FF that contributes to the improvement in the efficiency of the clock sequential test can be obtained using a combination logic amount of an input cone to the data input terminal DATA or a probability-based failure simulation or the like. Then only the user FF that has been selected is substituted with the seqSFF 60, whereby the scan chain is constructed.

FIG. 33 shows one example of the semiconductor device 1G in which the target to be substituted with the seqSFF 60 is limited to some user FFs. The semiconductor device 1G includes one or more scan chains. In the example shown in FIG. 33, a shift register structure 7D in the user logic is incorporated into at least one scan chain 6F among the plurality of scan chains. The scan chain 6F does not include an SFF. The scan chain 6F includes two seqSFFs 60 and a shift register structure 7D that has the seqSFF 60 at the top thereof and is arranged between the two seqSFFs 60. Since the configuration of the scan chain 6F is similar to that of the scan chain 6E according to the seventh embodiment, a detailed description thereof will be omitted.

Since the shift register structure 7D is included in the user FF that has been selected in FIG. 33, the shift register structure 7D is incorporated into the scan chain 6F. However, the present invention is not limited to this example. All the user FFs that have been selected may be substituted with the seqSFFs 60 and the scan chain 6F may be composed of only the seqSFFs 60.

At least one scan chain 6G among the plurality of scan chains does not include the seqSFF 60. The scan chain 6G includes two SFFs and a shift register 8 that has the SFF at the top thereof and is arranged between the two SFFs. The shift register 8 includes an SFF and two FFs. While the scan chain 6G includes the shift register 8, there may be a scan chain that does not include the shift register.

As described above, by limiting the target which is to be substituted with the seqSFF 60 to some user FFs in which the efficiency improvement effect of the clock sequential test is high, it is possible to suppress the increase in the area and to reduce the test time.

Ninth Embodiment

Figure 34:
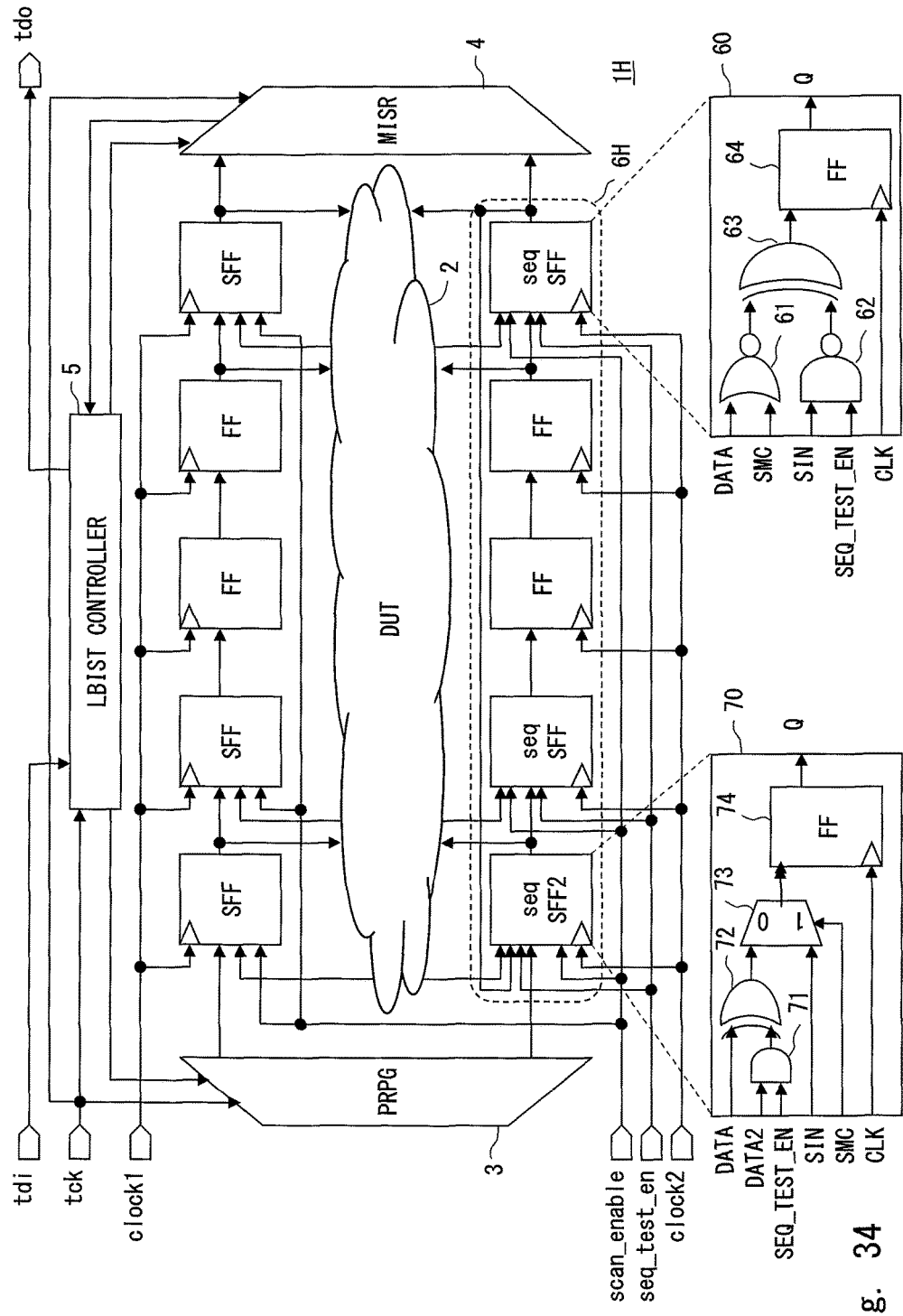
FIG. 34 is a diagram showing a configuration of a semiconductor device in which a scan flip-flop for a sequential test according to a ninth embodiment is inserted.

With reference to FIG. 34, a semiconductor device in which a scan flip-flop for a sequential test (seqSFF) according to a ninth embodiment is inserted will be described. FIG. 34 is a diagram showing a configuration of a semiconductor device 1H in which the seqSFF according to the ninth embodiment is inserted. As shown in FIG. 9, the semiconductor device 1H includes a DUT 2, a PRPG 3, an MISR 4, an LBIST controller 5, an seqSFF 60, and an seqSFF 70. In FIG. 34, the seqSFF 60 is indicated by an seqSFF and the seqSFF 70 is indicated by an seqSFF2.

In the semiconductor device 1H, the seqSFF 60 and the seqSFF 70 are included in at least one scan chain 6H among the plurality of scan chains. In the example shown in FIG. 34, the seqSFF 70 is arranged at the top of the scan chain 6H, a shift register structure including the seqSFF 60 and two normal FFs are arranged thereafter, and the seqSFF 60 is connected thereafter.

The seqSFF 60 may have the configuration shown in FIG. 16. While the seqSFF 60 is used in the example shown in FIG. 34, an seqSFF having another configuration that satisfies the functions of the truth table shown in FIG. 21 may be used in place of the seqSFF 60. Since the configuration other than the configuration of the seqSFF 70 is the same as that described with reference to FIG. 33, a detailed description thereof will be omitted.

In each of the other scan chains, the SFF is arranged at the top thereof and then the SFF, two normal FFs, and the SFF are connected in this order. That is, the shift register is included in the other scan chains. However, the present invention is not limited to this structure and the seqSFF 60 and the seqSFF 70 may be included in all the scan chains.

In the semiconductor device 1H according to the ninth embodiment, it is possible to hold the failure propagated to the seqSFF 60 at the last stage on the scan chain 6H in the clock sequential test. As shown in FIG. 34, the seqSFF 70 includes an AND gate 71, an XOR gate 72, an MUX 73, an FF 74, a data input terminal DATA, a data input terminal DATA2, a test enable input terminal SEQ_TEST_EN, a scan-in terminal SIN, a control input terminal SMC, a clock terminal CLK, and a data output terminal Q.

The output of the seqSFF 70 is connected to the scan-in terminal SIN of the subsequent seqSFF 60. The output of the seqSFF 60 at the last stage is connected to the data input terminal DATA2 of the seqSFF 70. The seqSFF 70 is able to capture, similar to the seqSFF 60, the operation result from the DUT 2 in each of the plurality of capture clocks in one capture operation period.

The operation result from the DUT 2 is input to the data input terminal DATA in the capture operation period. Further, the first operation result that the seqSFF 60 at the last stage has captured in the first capture clock is input to the data input terminal DATA2 in the capture operation period. That is, the seqSFF 70 includes data input terminals having two systems.

The AND gate 71 outputs the logical AND of the signal input through the data input terminal DATA2 and the test enable signal. The XOR gate 72 receives the signal input through the data input terminal DATA and the logical AND input from the AND gate 71 and outputs the exclusive OR thereof.

The MUX 73 receives the signal input through the scan-in terminal SIN and the signal output from the XOR gate 72. The MUX 73 switches the scan shift operation and the capture operation according to the scan enable signal input through the control input terminal SMC. In the example shown in FIG. 34, in the MUX 73, the input from the scan-in terminal SIN becomes valid when the scan enable signal is high (1). Further, in the MUX 73, the output from the XOR gate 72 becomes valid when the scan enable signal is low (0).

The FF 74 captures the value output from the MUX 73 according to the clock signal input through the clock terminal CLK (clock2) and outputs the captured value to the scan-in terminal SIN of the subsequent seqSFF 60 from the data output terminal Q.

The seqSFF 70 captures the value of the scan-in terminal SIN when the scan enable signal=1. Further, the seqSFF 70 captures the value from the data input terminal DATA when the test enable signal=0 and the scan enable signal=0. When the test enable signal=1 and the scan enable signal=0, the exclusive OR of the value of the data input terminal DATA and the value of the data input terminal DATA2 is captured in the second capture clock that comes after the first capture clock.

That is, the seqSFF 70 is able to concurrently capture the failure that has reached both the data input terminal DATA and the data input terminal DATA2. Therefore, the first operation result that the seqSFF 60 at the last stage of the scan chain 6H has captured in the first capture clock is propagated to the seqSFF 70 at the first stage in the second capture clock that comes after the first capture clock.

As described above, in the semiconductor device 1H according to the ninth embodiment, even when the capture clock is applied a plurality of times in one capture operation period in the clock sequential test, the failure captured by the seqSFF 60 at the last stage of the scan chain 6H in one capture clock is propagated to the seqSFF 70 at the first stage in the next capture clock and the failure does not disappear.

In the fifth to eighth embodiments, the operation result captured by the seqSFF 60 at the last stage of the scan chain in one capture clock in the clock sequential test is propagated to nowhere in the next capture cycle and it disappears.

When the circuit configuration shown in FIG. 34 is used as in the ninth embodiment, however, the operation result captured by the seqSFF 60 at the last stage can be propagated to the seqSFF 70 at the first stage in the capture clock in the next capture cycle, whereby it is possible to prevent the failure from being disappeared. As a result, when the capture clock is applied a plurality of times in the capture operation period, the number of failures that can be detected increases, whereby it is possible to reduce the test time and to improve the fault coverage.

Figures 35, 36:
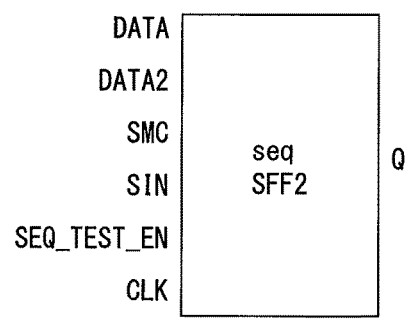
FIG. 35 is a diagram showing a schematic configuration of the scan flip-flop for the sequential test used in the ninth embodiment.
FIG. 36 is a truth table of the scan flip-flop for the sequential test shown in FIG. 35.

The logical structure of the seqSFF2 is not limited to the logical structure of the seqSFF 70 shown in FIG. 34. The seqSFF 70 may have any configuration as long as it has the schematic configuration of the scan flip-flop for the sequential test shown in FIG. 35 and it satisfies the functions shown in the truth table shown in FIG. 36.

That is, when the scan enable signal is 0 and the test enable signal is 0, the value of the data input terminal DATA is captured. When the scan enable signal is 0 and the test enable signal is 1, the exclusive OR of the value of the data input terminal DATA and the value of the data input terminal DATA2

DATA⊕DATA2 or the negative exclusive OR thereof

¬(DATA⊕DATA2)

is captured.

When the scan enable signal is 1, regardless of the value of the test enable signal, the negative value of the value of the scan-in terminal SIN (SIN) or the value of the scan-in terminal SIN

¬SIN is captured.

Tenth Embodiment

Figure 37:
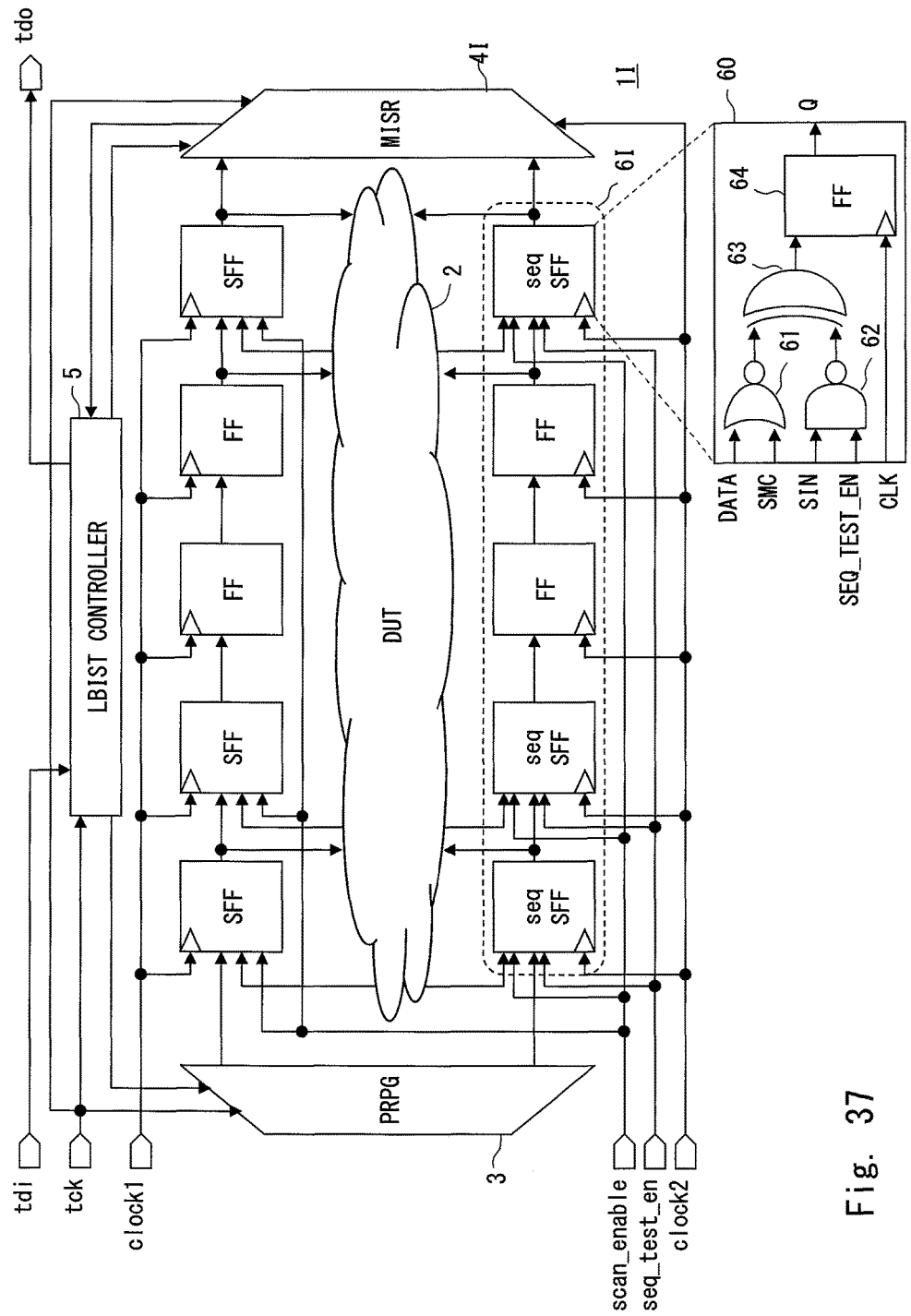
FIG. 37 is a diagram showing a configuration of a semiconductor device in which a scan flip-flop for a sequential test according to a tenth embodiment is inserted.

With reference to FIG. 37, a semiconductor device in which a scan flip-flop for a sequential test (seqSFF) according to a tenth embodiment is inserted will be described. FIG. 37 is a diagram showing a configuration of a semiconductor device 1I in which the seqSFF according to the tenth embodiment is inserted. As shown in FIG. 37, the semiconductor device 1I includes a DUT 2, a PRPG 3, an MISR 4I, an LBIST controller 5, and an seqSFF 60. In the semiconductor device 1I, in the clock sequential test, the failure that has propagated to the seqSFF 60 at the last stage can be held by the MISR 4I.

In the semiconductor device 1I, at least one scan chain 6I among a plurality of scan chains includes the seqSFF 60 and the normal FF. In the example shown in FIG. 37, the seqSFF 60 is arranged at the top of the scan chain 6I, a shift register structure including the seqSFF 60 and two normal FFs is arranged thereafter, and the seqSFF 60 is arranged thereafter.

The observation SFF 30 may have the configuration shown in FIG. 16. While the seqSFF 60 is used in the example shown in FIG. 34, an seqSFF having another configuration that satisfies the functions of the truth table shown in FIG. 21 may be used in place of the seqSFF 60. In the other scan chains, the SFF is arranged at the top thereof, and then the SFF, two normal FFs, and the SFF are connected in this order. Since the configuration of the scan chain is the same as that shown in FIG. 33, a detailed description thereof will be omitted.

The first operation result that the seqSFF 60 at the last stage of the scan chain 6I has captured in the first capture clock is propagated to the MISR 4I in the second capture clock that comes after the first capture clock. In the example shown in FIG. 37, a clock signal (clock 2) is input to the MISR 4I. The MISR 4C captures the value output from the seqSFF 60 at the last stage in synchronization with the clock signal (clock2).

In the normal scan test, there is no need to observe the output of the flip-flop at the final stage of the scan chain in the capture operation period. Therefore, the MISR does not generally include a function of capturing the output value of the flip-flop at the final stage in the capture operation period.

In the tenth embodiment, the MISR 4I is supplied with the clock and operates also in the capture operation period. Accordingly, the MISR 4I is able to capture the output value of the seqSFF 60 at the final stage of the scan chain 6I also when the capture clock is applied a plurality of times in the clock sequential test.

As described above, in each capture cycle, the failure that has reached the seqSFF 60 at the last stage can be captured by the MISR 4I. It is therefore possible to observe the failure without causing the failure to disappear. It is therefore possible to increase the number of failures that can be detected during one capture operation period of the clock sequential test and to reduce the test time.

Figure 38:
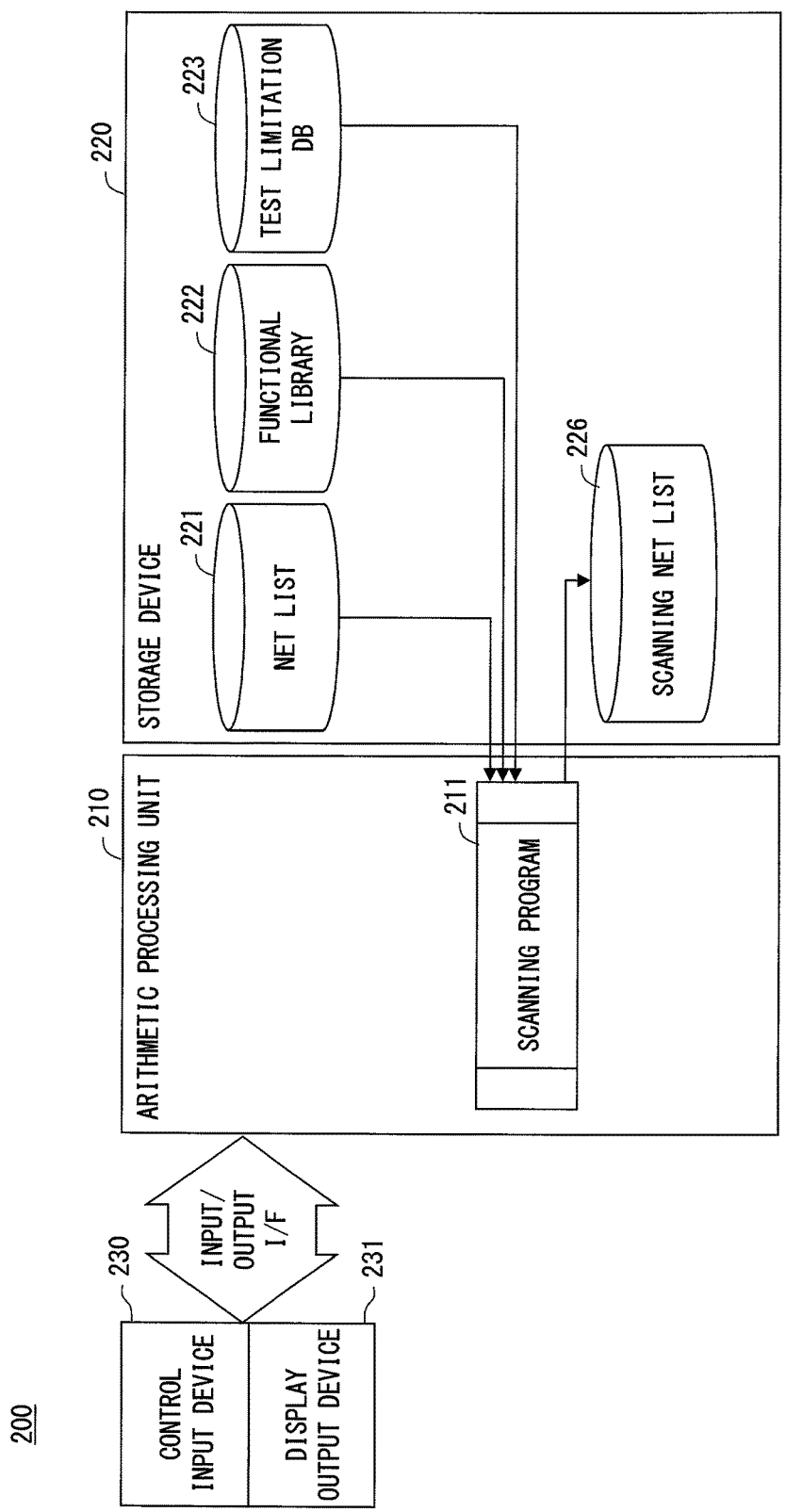
FIG. 38 is a diagram showing a configuration of a design device that designs the semiconductor device according to the embodiment.
Figure 39:
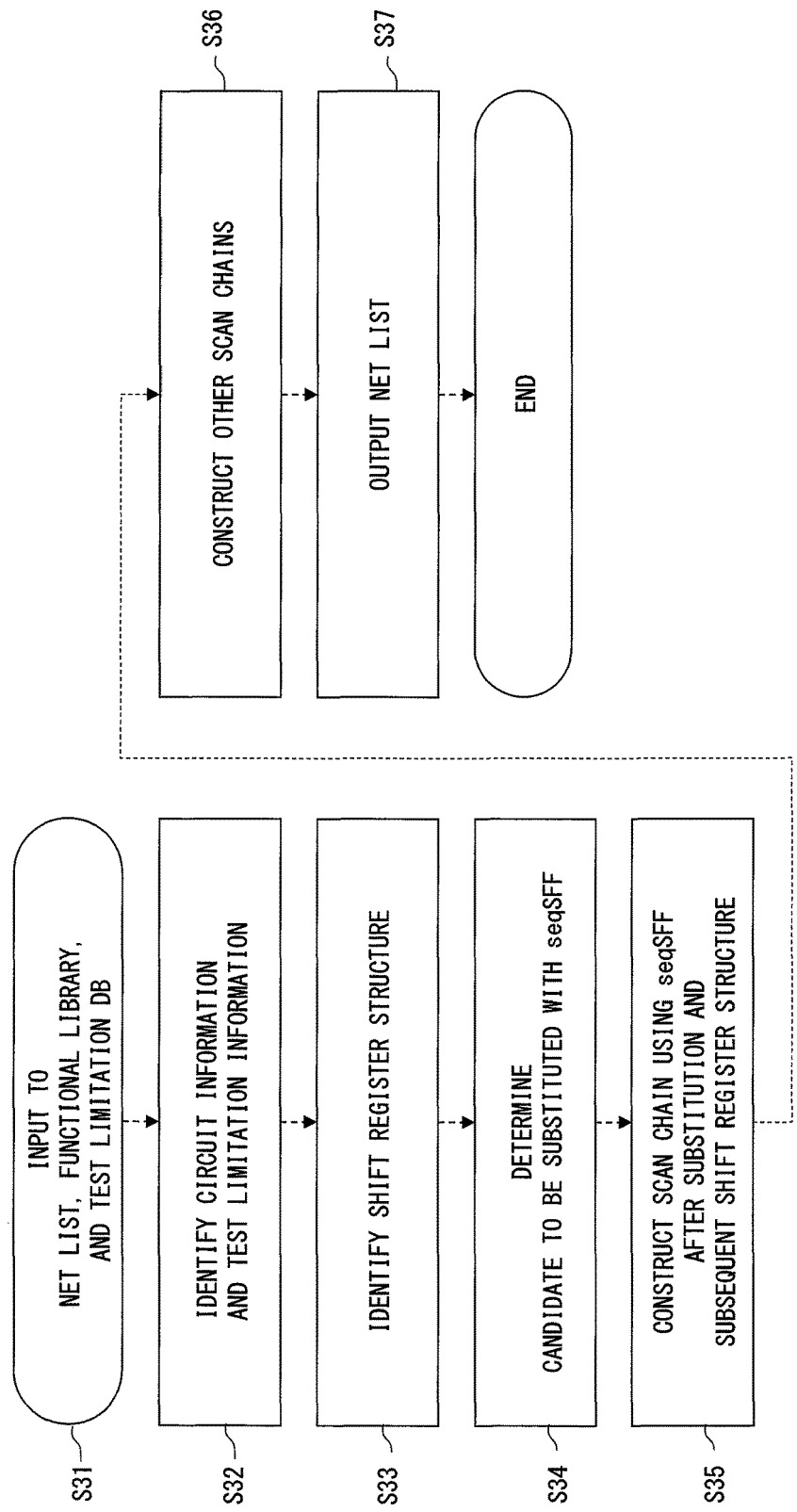
FIG. 39 is a diagram showing a design flow of the semiconductor device according to the embodiment.

With reference to FIGS. 38 and 39, a design device 200 according to this embodiment will be described. FIG. 38 is a diagram showing a configuration of the design device 200 that designs the semiconductor device according to the fifth to tenth embodiments. FIG. 39 is a diagram showing a design flow of the semiconductor device according to this embodiment. The design device 200 designs the semiconductor device using the above seqSFFs in which the efficiency of the clock sequential test is high.

The design device 200 includes an arithmetic processing unit 210, a storage device 220, a control input device 230, and a display output device 231. Since the control input device 230 and the display output device 231 have configurations similar to those of the control input device 130 and the display output device 131 described with reference to FIG. 12, descriptions thereof will be omitted as appropriate.

The arithmetic processing unit 210 is an apparatus capable of loading a program necessary for the design of the semiconductor devices 1D to 1I and executing each functional process necessary for the design and includes a CPU, a memory and the like. The arithmetic processing unit 210 includes a scanning program 211. The scanning program 211 includes, besides a general function of scanning, a function of selecting, from among the user FFs to be scanned, the user FF in which the effect when the clock sequential test is applied would become high if it were substituted with the seqSFF that satisfies the functions of the truth table shown in FIG. 21.

The storage device 220 includes a net list 221, a functional library 222, a test limitation DB 223, and a scanned net list 226. The storage device 220 indicates a storage medium such as a HDD disc or a memory that stores information in the library and the net list.

The net list 221 stores, besides cell information of the seqSFFs stated above, cell information of the AND gate, the OR gate, the XOR gate and the like, connection information among the terminals and the like. The functional library 222 stores functions of the cell and the like. The test limitation DB 223 stores information necessary for the circuit operation when the test is performed.

The design device 200 generates the semiconductor device in which the seqSFF is inserted described in the fifth to tenth embodiments by referring to the net list 221, the functional library 222, and the test limitation DB 223 of the storage device 220 using the scanning program 212 of the arithmetic processing unit 210.

With reference next to FIG. 39, a design flow of the semiconductor device will be described. As shown in FIG. 39, first, predetermined information is input to the net list 221, the functional library 222, and the test limitation DB 223 (Step S31). After that, by analyzing the input information, the circuit information and the test limitation information are identified (Step S32). In this example, information on a scannable user FF in the circuit, the test limitation information and the like are acquired. The user FF that includes the shift register structure is identified from the circuit configuration (Step S33).

Then, a desired number of user FFs to be substituted with the seqSFF are selected in consideration of the area overhead based on the information on the scannable user ET that has been identified to determine the candidate to be substituted with the seqSFF (Step S34). The algorithm for selecting the candidate to be substituted with the seqSFF can be reduced, for example, to a problem of obtaining maximization of the number of failures that can be observed on the input logic cone of the user FF to be substituted.

After the candidate to be substituted with the seqSFF has been determined, the user FF to be substituted is substituted with the seqSFF and the scan chain is constructed using the subsequent shift register structure (Step S35). The other user FFs are also substituted with the SFF, whereby the scan chain is constructed (Step S36). The scanned net list in which the seqSFF is inserted is output (Step S37), and the processing for generating the net list is thus completed. By using the design device 200 shown in FIG. 38, it is possible to generate the scanned net list having a circuit configuration in which the efficiency of the sequential test is high.

By using the scanned net list thus generated, it is possible to increase the number of failures that can be detected during one capture operation period of the clock sequential test and to design the semiconductor device capable of reducing the test execution time.

In the following processes, the compression scanning circuit or the LBIST circuit is added by a general compression circuit addition program and a clock sequential test pattern is generated by a general test generation program. It is therefore possible to obtain the effect of reducing the test time as shown in FIG. 31.

Figure 40:
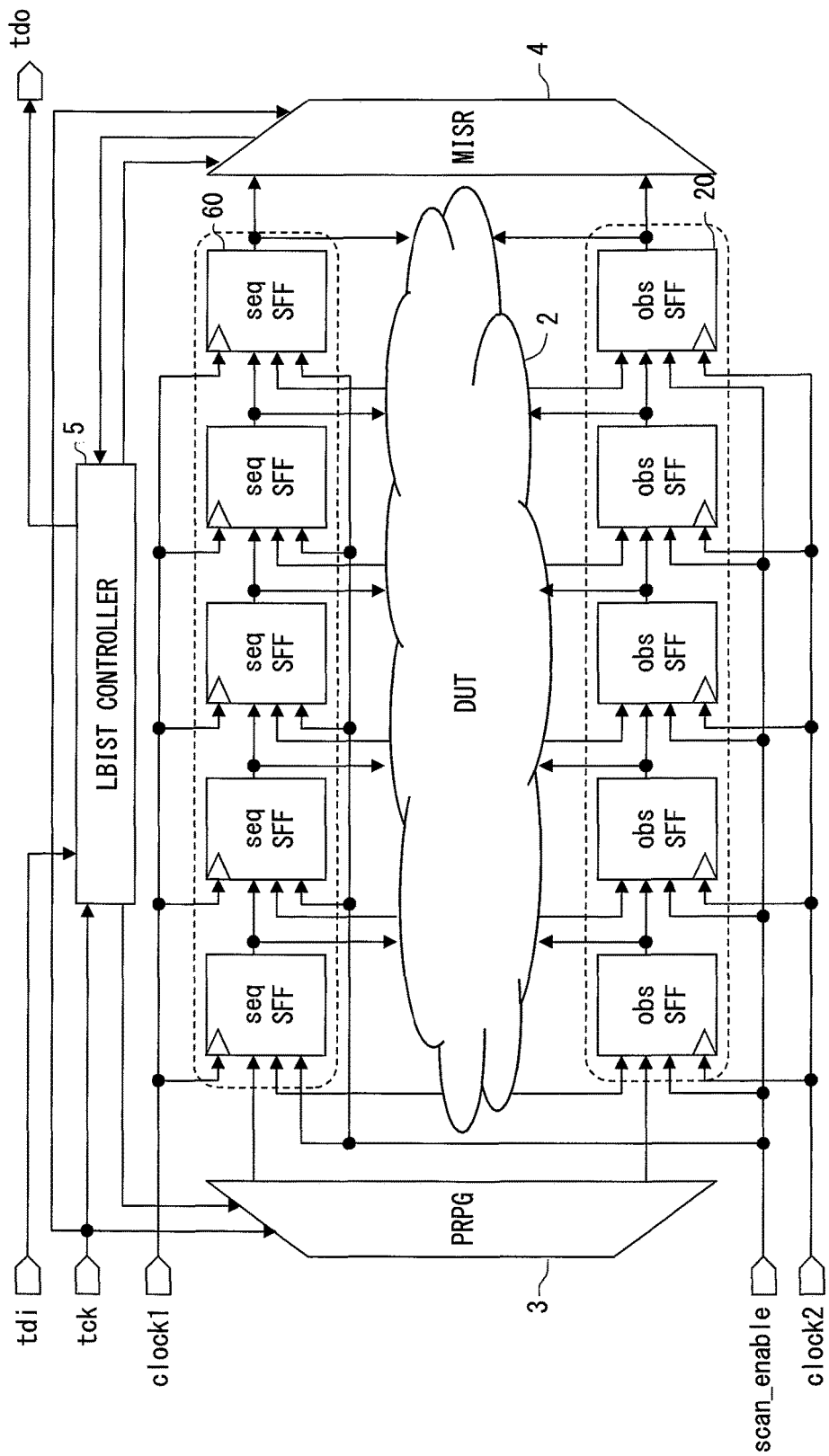
FIG. 40 is a diagram showing a configuration of a semiconductor device in which a test point circuit and a scan flip-flop for a sequential test according to the embodiment are inserted.

The aforementioned embodiments can be combined as appropriate. For example, a semiconductor device in which both the test point circuit and the scan flip-flop for the sequential test described above are inserted can be formed. FIG. 40 shows a configuration example of a semiconductor device in which the test point circuits 20 and the seqSFFs 60 are inserted.

As shown in FIG. 40, at least one of the plurality of scan chains is composed of only the observation SFFs 20. Further, at least one of the other scan chains is composed of only the seqSFFs 60. In the example shown in FIG. 40, five observation SFFs 20 are connected in serial in one scan chain. Further, five seqSFFs 60 are connected in serial in the other scan chain.

As described above, by inserting the observation SFFs 20 and the seqSFFs 60, it is possible to suppress the increase in the area overhead due to the insertion of the test point when the clock sequential test is performed and to increase the fault coverage while reducing the test time.

While the invention made by the present inventors has been specifically described based on the embodiments, it is needless to say that the present invention is not limited to the embodiments stated above and may be changed in various ways without departing from the spirit of the present invention.

The above embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A test point circuit that is inserted in a combination circuit, the combination circuit outputting an operation result in accordance with a test signal that is scanned in, the test point circuit comprising:
 a scan-in terminal that receives the test signal in a scan shift operation period;
 a data input terminal that receives the operation result from the combination circuit;
 an XOR gate that receives the operation result input to the data input terminal and a first operation result input to the scan-in terminal and outputs an exclusive OR of the operation result and the first operation result in a capture operation period of a clock sequential test; and
 a flip-flop that captures the exclusive OR in a second capture clock that is within the capture operation period and that occurs after a first capture clock of the capture operation period,
 wherein the test point circuit is one of a plurality of test point circuits that constitute a scan chain, and
 wherein, in the second capture clock that occurs after the first capture clock in the capture operation period of the clock sequential test, the test point circuit captures the first operation result that another test point circuit at a previous stage or a last stage of the scan chain captured in the first capture clock, and
 wherein the scan-in terminal receives the first operation result.

2. The test point circuit according to claim 1, further comprising:
 an NOR gate that receives the operation result input to the data input terminal and a control signal that switches the scan shift operation to the capture operation and outputs a negative OR of the operation result and the control signal in the capture operation period,
 wherein the XOR gate receives the first operation result input to the scan-in terminal and the negative OR and outputs an exclusive OR of the first operation result and the negative OR, and
 wherein the flip-flop captures the exclusive OR input from the XOR gate in the second capture clock.

3. The test point circuit according to claim 1, further comprising:
 a first data input terminal that receives the operation result from the combination circuit;
 a second data input terminal that receives the first operation result captured by the test point circuit at the last stage of the scan chain in the capture operation period,
 wherein the XOR gate receives the operation result input to the first data input terminal and the first operation result input to the second data input terminal and outputs an exclusive OR of the operation result and the first operation result in the capture operation period, and
 wherein the flip-flop captures the exclusive OR in the second capture clock.

4. A semiconductor device comprising:
 a combination circuit that outputs an operation result in accordance with a test signal that is scanned in; and a plurality of test point circuits that are inserted in the combination circuit, wherein:
the plurality of test point circuits constitute a scan chain, and
the scan chain comprises:
a first test point circuit that captures a first operation result in a first capture clock in one capture operation period of a clock sequential test; and
a second test point circuit that captures the first operation result captured by the first test point circuit in a second capture clock that comes after the first capture clock in the one capture operation period of the clock sequential test,
wherein the second test point circuit comprises:
a scan-in terminal that receives the test signal in a scan shift operation period and receives the first operation result captured by the previous test point circuit of the scan chain in the capture operation period;
a data input terminal that receives the operation result from the combination circuit;
an XOR gate that receives the operation result input to the data input terminal and the first operation result input to the scan-in terminal and outputs an exclusive OR of the operation result and the first operation result in the capture operation period; and
a flip-flop that captures the exclusive OR in the second capture clock.

5. The semiconductor device according to claim 4, wherein the second test point circuit is provided after the first test point circuit.

6. The semiconductor device according to claim 5, further comprising a third test point circuit arranged at a last stage of the scan chain, wherein:
the first test point circuit is provided in a first stage of the scan chain,
the third test point circuit captures a second operation result in the first capture clock, and
the first test point circuit receives the second operation result captured by the third test point circuit in the second capture clock.

7. The semiconductor device according to claim 4, wherein:
the first test point circuit is provided at a last stage of the scan chain, and
the second test point circuit is provided in a first stage of the scan chain.

8. The semiconductor device according to claim 4, further comprising a compressor that compresses a response result output from the scan chain,
wherein the compressor capture an operation result in the second capture clock, the operation result having been captured by the test point circuit provided at a last stage of the scan chain in the first capture clock.

9. The semiconductor device according to claim 4, wherein the second test point circuit further comprises:
an NOR gate that receives the operation result input to the data input terminal and a control signal that switches the scan shift operation to the capture operation and outputs a negative OR of the operation result and the control signal in the capture operation period,
wherein the XOR gate receives the first operation result input to the scan-in terminal and the negative OR and outputs an exclusive OR of the first operation result and the negative OR, and
wherein that the flip-flop captures the exclusive OR input from the XOR gate in the second capture clock.

10. The semiconductor device according to claim 4, wherein the second test point circuit comprises:
a scan-in terminal that receives the test signal in a scan shift operation period;
a first data input terminal that receives the operation result from the combination circuit;
a second data input terminal that receives the first operation result captured by the test point circuit at a last stage of the scan chain in the capture operation period;
an XOR gate that receives the operation result input to the first data input terminal and the first operation result input to the second data input terminal and outputs an exclusive OR of the operation result and the first operation result in the capture operation period; and
a flip-flop that captures the exclusive OR in the second capture clock.

11. The semiconductor device according to claim 4, further comprising a pseudo random pattern generator that is provided in an input side of the scan chain and supplies a pseudo random number as the test signal.

12. A design device of a semiconductor device comprising an arithmetic processing unit capable of executing predetermined processing in accordance with a program that has been set in advance, wherein:
the semiconductor device comprises:
a combination circuit that outputs an operation result in accordance with a test signal that is scanned in; and
a plurality of test point circuits that are inserted in the combination circuit,
the plurality of test point circuits constitute a scan chain, and
the scan chain comprises:
a first test point circuit that captures a first operation result in a first capture clock in one capture operation period of a clock sequential test; and
a second test point circuit that captures the first operation result captured by the first test point circuit in a second capture clock that comes after the first capture clock in the one capture operation period of the clock sequential test,
wherein the second test point circuit comprises:
a scan-in terminal that receives the test signal in a scan shift operation period and receives the first operation result captured by the previous test point circuit of the scan chain in the capture operation period;
a data input terminal that receives the operation result from the combination circuit;
an XOR gate that receives the operation result input to the data input terminal and the first operation result input to the scan-in terminal and outputs an exclusive OR of the operation result and the first operation result in the capture operation period; and
a flip-flop that captures the exclusive OR in the second capture clock.

13. The design device according to claim 12, wherein:
the arithmetic processing unit executes processing for analyzing the probability that the operation result from the combination circuit becomes a predetermined logic state,
the arithmetic processing unit selects a position in which the test point circuit is inserted based on the result of the analysis processing,
the arithmetic processing unit inserts the first test point circuit and the second test point circuit in the selected position, and the arithmetic processing unit constitutes the scan chain using the first test point circuit and the second test point circuit.

14. The design device according to claim 12, wherein the arithmetic processing unit executes processing for connecting the second test point circuit after the first test point circuit in the scan chain.

15. The design device according to claim 12, wherein:
the semiconductor device further comprises, a third test point circuit that constitutes the scan chain besides the first and second test point circuits and captures a second operation result in the second capture clock, and
the arithmetic processing unit executes processing for connecting the first test point circuit to a first stage of the scan chain and the third test point circuit to a last stage of the scan chain so that the first test point circuit receives the second operation result.

16. The design device according to claim 12, wherein the arithmetic processing unit executes processing for connecting the first test point circuit to a last stage of the scan chain and the second test point circuit to a first stage of the scan chain.

17. The design device according to claim 12, wherein the arithmetic processing unit executes processing for inserting a compressor that compresses a response result output from the scan chain into an output side of the test point circuit provided at a last stage of the scan chain.

18. The design device according to claim 17, wherein the compressor captures an operation result in the second capture clock, the operation result having been captured by the test point circuit provided at the last stage of the scan chain in the first capture clock.

19. A scan flip-flop for a sequential test that constitutes a scan chain and is able to switch a scan shift operation and a capture operation, the scan flip-flop for the sequential test operating as a shift register in the scan shift operation and capturing an operation result from a combination circuit in the capture operation, wherein:
the scan flip-flop for the sequential test comprises a test enable input terminal that receives a test enable signal,
in accordance with the test enable signal, in one capture operation period of a clock sequential test,
the scan flip-flop for the sequential test captures a first operation result from the combination circuit in a second capture clock that comes after a first capture clock, the first operation result having been captured by a first cell provided before the scan flip-flop for the sequential test in the scan chain or provided at a last stage of the scan chain in the first capture clock,
wherein the scan flip-flop for the sequential test captures an exclusive OR or a negative exclusive OR of the first operation result and a second operation result from the combination circuit in the second capture clock, the second operation result having been captured by the scan flip-flop for the sequential test.

20. A semiconductor device comprising a scan chain and a combination circuit, the scan chain comprising the scan flip-flop for the sequential test according to claim 19 and a first cell, the semiconductor device being capable of switching a scan shift operation and a capture operation, the scan shift operation operating the first cell in the scan chain and the scan flip-flop for the sequential test as a shift register, and the capture operation capturing an operation result from the combination circuit, wherein:
the first cell captures a first operation result in a first capture clock in one capture operation period of a clock sequential test,
the scan flip-flop for the sequential test comprises a test enable input terminal that receives a test enable signal, and
the scan flip-flop for the sequential test captures the first operation result in a second capture clock that comes after the first capture clock in accordance with the test enable signal.

21. The semiconductor device according to claim 20, wherein:
the first cell is a scan flip-flop; and
the scan flip-flop for the sequential test is connected after the first cell in the scan chain.

22. The semiconductor device according to claim 20, wherein the first cell has a configuration similar to that of the scan flip-flop for the sequential test.

23. The semiconductor device according to claim 20, wherein the scan chain further comprises a shift register structure comprising:
a second cell that has a configuration similar to that of the scan flip-flop for the sequential test; and
a flip-flop that directly captures a third operation result from the combination circuit captured by the second cell.

24. The semiconductor device according to claim 21, further comprising a compressor that compresses a response result output from the scan chain,
wherein the compressor observes an operation result in the second capture clock, the operation result having been captured by the scan flip-flop for the sequential test provided at a last stage of the scan chain in the first capture clock.

* * * * *